(12) United States Patent
Wu

(10) Patent No.: US 9,160,330 B2
(45) Date of Patent: Oct. 13, 2015

(54) BOOST CAPACITOR SHARING ARCHITECTURE FOR POWER SUPPLY ACTIVE BALANCING SYSTEMS

(71) Applicant: Texas Instruments Incorporated, Dallas, TX (US)

(72) Inventor: Jian-Yi Wu, San Ramon, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 362 days.

(21) Appl. No.: 13/886,092

(22) Filed: May 2, 2013

(65) Prior Publication Data

US 2014/0327399 A1    Nov. 6, 2014

(51) Int. Cl.
  H02J 7/00      (2006.01)
  H03K 3/00      (2006.01)
  H02M 3/335     (2006.01)
  G05F 1/00      (2006.01)
  H03K 17/693    (2006.01)
  H03K 17/725    (2006.01)

(52) U.S. Cl.
  CPC ............ H03K 17/693 (2013.01); H02J 7/0052 (2013.01); H03K 17/725 (2013.01)

(58) Field of Classification Search
  CPC .............................. H03K 17/693; H02J 7/0052
  USPC ................... 320/116; 363/21.02, 25; 327/109; 323/288
  See application file for complete search history.

(56) References Cited

U.S. PATENT DOCUMENTS

| 5,710,504 | A  | * | 1/1998 | Pascual et al. | 180/65.8 |
| 6,066,943 | A  | * | 5/2000 | Hastings et al. | 323/285 |
| 6,115,309 | A  | * | 9/2000 | Coleman, Jr. | 365/208 |
| 7,629,949 | B2 | * | 12/2009 | Yang | 345/63 |
| 7,633,327 | B1 | * | 12/2009 | Zhang et al. | 327/337 |
| 7,817,446 | B2 |   | 10/2010 | Endo et al. | |
| 8,207,703 | B2 | * | 6/2012 | Kurose et al. | 320/116 |
| 8,410,770 | B2 | * | 4/2013 | Farley | 323/288 |
| 2002/0075700 | A1 |   | 6/2002 | Birumachi | |

(Continued)

FOREIGN PATENT DOCUMENTS

KR      2010126235      12/2010
KR      1020100126235 A 12/2010

OTHER PUBLICATIONS

PCT Search Report mailed Mar. 22, 2013.

(Continued)

*Primary Examiner* — M'Baye Diao
(74) *Attorney, Agent, or Firm* — William B. Kempler; Frank D. Cimino

(57) ABSTRACT

An apparatus includes multiple first channels configured to be coupled to a first boost capacitor and multiple second channels configured to be coupled to a second boost capacitor. Each channel includes a transistor switch and a gate driver configured to drive the transistor switch. The gate drivers in the first channels include switch sub-arrays configured to control which transistor switch in the first channels is driven using a voltage from the first boost capacitor. The gate drivers in the second channels include switch sub-arrays configured to control which transistor switch in the second channels is driven using a voltage from the second boost capacitor. The transistor switch in each channel may include first and second transistors having their sources coupled together, and each of the channels may further include a pull-down switch configured to pull the sources of the first and second transistors to ground.

20 Claims, 19 Drawing Sheets

(56) References Cited

U.S. PATENT DOCUMENTS

2009/0096516 A1    4/2009  Nakashima
2009/0189448 A1    7/2009  Verschueren
2011/0115436 A1*  5/2011  Zhang et al. .................. 320/134

OTHER PUBLICATIONS

U.S. Appl. No. 13/644,664, filed Oct. 4, 2012.
U.S. Appl. No. 13/644,345, filed Oct. 4, 2012.
Notification of Transmittal of the International Search Report and the Written Opinion of the International Searching Authority, or the Declaration dated Mar. 22, 2013 in connection with International Patent Application No. PCT/US2012/060023.
Qingguo Liu, "Inductor-Based Active Balancing for Batteries and Other Power Supplies", U.S. Appl. No. 13/644,664, filed Oct. 4, 2012.
Qingguo Liu, "Capacitor-Based Active Balancing for Batteries and Other Power Supplies", U.S. Appl. No. 13/644,345, filed Oct. 4, 2012.

* cited by examiner

BOOST CAPACITOR SHARING ARCHITECTURE FOR POWER SUPPLY ACTIVE BALANCING SYSTEMS

TECHNICAL FIELD

This disclosure is generally directed to active balancing systems for power supplies. More specifically, this disclosure is directed to a boost capacitor sharing architecture for power supply active balancing systems.

BACKGROUND

Modern batteries often include multiple battery cells connected in series, and multiple batteries can be connected in series to form a battery module. Unfortunately, the actual output voltage provided by each individual battery cell in a battery or each battery in a battery module may vary slightly. This can be caused by any number of factors, such as manufacturing variations, temperature variations, or other internal or external factors. This can cause problems during charging and discharging of the battery cells or batteries. In some systems, voltage detection circuitry can be used to determine the output voltage of each battery cell or battery, and a voltage balancing system can be used to compensate for variations in the output voltages.

Consider battery cells connected in series, where each battery cell is designed to provide an output voltage of 3.8V. Voltage detection circuitry may determine that one battery cell actually has an output voltage of 3.9V. A conventional passive voltage balancing system typically includes resistors that dissipate electrical energy from battery cells or batteries having excessive output voltage. In this example, the dissipation of electrical energy causes the 3.9V output voltage to drop to the desired level of 3.8V. However, since electrical energy is dissipated, this can result in significant energy being lost from the battery cell, which shortens the operational life of the battery.

SUMMARY

This disclosure provides a boost capacitor sharing architecture for power supply active balancing systems.

In a first embodiment, an apparatus includes multiple first channels configured to be coupled to a first boost capacitor and multiple second channels configured to be coupled to a second boost capacitor. Each channel includes a transistor switch and a gate driver configured to drive the transistor switch. The gate drivers in the first channels include switch sub-arrays configured to control which transistor switch in the first channels is driven using a voltage from the first boost capacitor. The gate drivers in the second channels include switch sub-arrays configured to control which transistor switch in the second channels is driven using a voltage from the second boost capacitor.

In a second embodiment, a system includes a first boost capacitor, a second boost capacitor, and boost capacitor sharing circuitry that includes multiple first channels coupled to the first boost capacitor and multiple second channels coupled to the second boost capacitor. Each channel includes a transistor switch and a gate driver configured to drive the transistor switch. The gate drivers in the first channels include switch sub-arrays configured to control which transistor switch in the first channels is driven using a voltage from the first boost capacitor. The gate drivers in the second channels include switch sub-arrays configured to control which transistor switch in the second channels is driven using a voltage from the second boost capacitor.

In a third embodiment, a method includes operating multiple first channels coupled to a first boost capacitor and multiple second channels coupled to a second boost capacitor. Each of the channels includes a transistor switch and a gate driver configured to drive the transistor switch. The method also includes transferring energy between power supplies through the channels. The gate drivers in the first channels include switch sub-arrays controlling which transistor switch in the first channels is driven using a voltage from the first boost capacitor. The gate drivers in the second channels include switch sub-arrays controlling which transistor switch in the second channels is driven using a voltage from the second boost capacitor.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 18, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
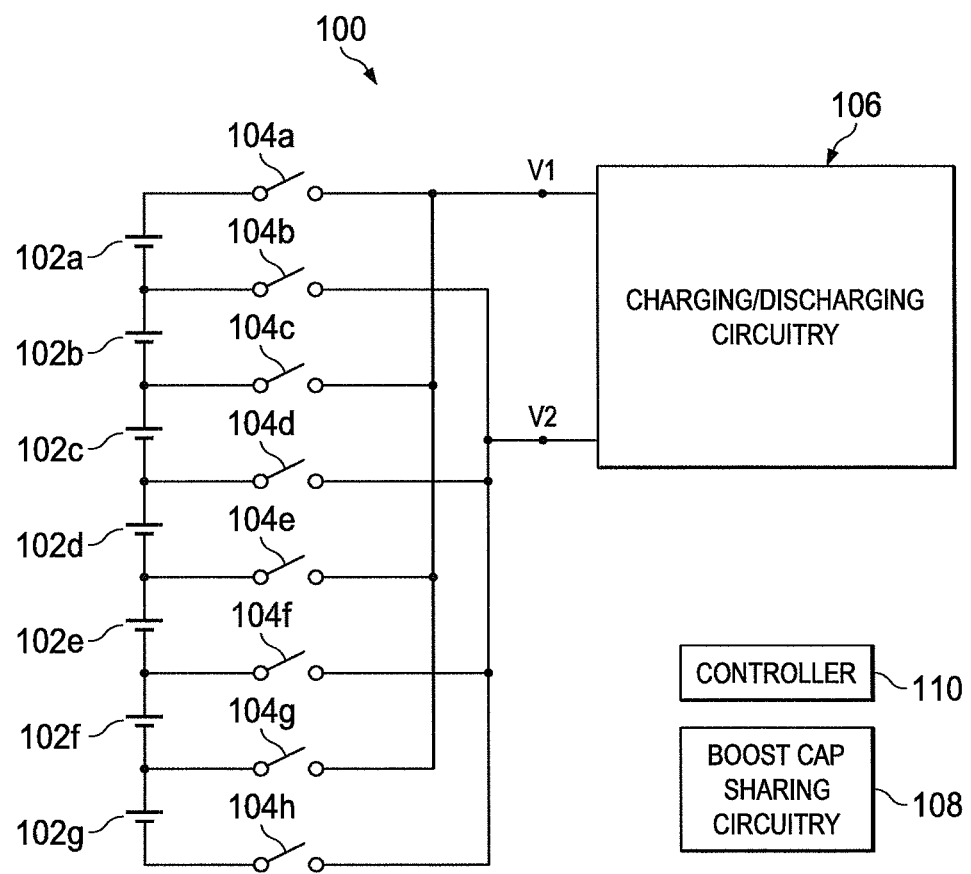
FIG. 1 illustrates an example active balancing system for batteries and other power supplies in accordance with this disclosure.

FIG. 1 illustrates an example active balancing system 100 for batteries and other power supplies in accordance with this disclosure. As shown in FIG. 1, the system 100 includes or is coupled to multiple power supplies 102a-102g connected in series. Each power supply 102a-102g represents any suitable source of power, such as a single battery cell. In particular embodiments, each power supply 102a-102g represents a single battery cell having a nominal voltage of 3.2V. However, each power supply 102a-102g could also represent multiple battery cells, a battery module, multiple battery modules, or other collection of battery cells. Any other types of power supplies could also be used, such as super-capacitors, fuel cells, and solar cells. Also note that any number of power supplies could be used here.

Multiple switches 104a-104h are coupled to the power supplies 102a-102g. The switches 104a-104h are opened and closed to transfer energy between selected power supplies 102a-102g via charging/discharging circuitry 106. The switches 104a-104h represent any suitable switching devices, such as transistors. In particular embodiments, each of the switches 104a-104h represents two back-to-back MOSFET transistors to prevent the short-circuit of two neighboring cells by the MOSFET body diode. Any single-switch devices with no body diodes can also be used here.

The charging/discharging circuitry 106 transfers energy between the selected power supplies 102a-102g. For example, the charging/discharging circuitry 106 can discharge one or more of the power supplies 102a-102g by receiving and storing energy from the one or more power supplies. The charging/discharging circuitry 106 can also charge one or more of the power supplies 102a-102g by providing stored energy to the one or more power supplies. The charging/discharging circuitry 106 can be implemented in various ways, examples of which are provided below. The charging/discharging circuitry 106 includes any suitable structure(s) for charging and discharging one or more power supplies.

The switches 104a-104h can be implemented using a transistor-based switch array. It is common for each switch 104a-104h in a transistor-based switch array to have its own gate driver, and it is common for every gate driver to have its own boost capacitor. In accordance with this disclosure, boost capacitor sharing circuitry 108 is used to allow the gate drivers of the switches 104a-104h in the switch array to share the same boost capacitors. For instance, when only a single power supply 102a-102g is charged or discharged at any given time, only two boost capacitors may be needed to drive the switches 104a-104h to form a charging or discharging loop. The boost capacitor sharing circuitry 108 supports the sharing of the same boost capacitors to drive multiple switches 104a-104h. Additional details regarding the boost capacitor sharing circuitry 108 are provided below. The boost capacitor sharing circuitry 108 includes any suitable structure(s) for sharing boost capacitors among multiple transistor switches.

A controller 110 controls the overall operation of the system 100. For example, the controller 110 could control the operation of the switches 104a-104h, the charging/discharging circuitry 106, and the boost capacitor sharing circuitry 108 to control the charging and discharging of the power supplies 102a-102g. The controller 110 includes any suitable structure for controlling the charging and discharging of power supplies. For instance, the controller 110 could include a pulse width modulation (PWM) controller that generates control signals for the various switches, where the control signals have variable duty cycles controlled using PWM.

The system 100 could be used in any type of device or system in which active balancing of power supplies is required or desired. For instance, the system 100 could be used with the power supplies in electric vehicles or hybrid electric vehicles, such as to balance lithium ion batteries or other types of batteries. Any other device or system that uses multiple power supplies could also include the system 100.

Although FIG. 1 illustrates one example of an active balancing system 100 for batteries and other power supplies, various changes may be made to FIG. 1. For example, any suitable number(s), type(s), and arrangement(s) of power supplies could be used in the system 100. Also, various components in FIG. 1 could be rearranged as desired, and additional components could be added to the system 100 according to particular needs. In addition, while specific circuit components are shown, other circuit components for performing the same or similar function(s) could be used.

As noted above, the system 100 could be implemented using a transistor-based switch array for the switches 104a-104h. The boost capacitor sharing circuitry 108 allows the same boost capacitors to be used to drive multiple switches 104a-104h. In some embodiments, only two boost capacitors can be shared amongst all of the switches 104a-104h. In the following discussion, a distinction is made between "odd" and "even" switches 104a-104h. Here, "odd" and "even" refer to the number assigned to the switches when the switches are numbered in series. In this example, the switches 104a, 104c, 104e, 104g could represent "odd" switches that couple to a first node V1, and the switches 104b, 104d, 104f, 104h could represent "even" switches that couple to a second node V2. This distinction is used since, in some embodiments, one boost capacitor can be shared to drive odd-numbered switches and another boost capacitor can be shared to drive even-numbered switches.

This arrangement allows only two boost capacitors to be used to support the transfer of energy from any single power supply 102a-102g to any other single power supply 102a-102g. This arrangement also allows only two boost capacitors to be used to support the transfer of energy from a combination of power supplies 102a-102g to another combination of power supplies 102a-102g (as long as each combination of power supplies can be charged or discharged using an odd-numbered switch and an even-numbered switch). This arrangement further allows only two boost capacitors to be used to support the transfer of energy from a combination of power supplies 102a-102g to a single power supply 102a-102g or from a single power supply 102a-102g to a combination of power supplies 102a-102g (as long as each combination of power supplies can be charged or discharged using an odd-numbered switch and an even-numbered switch).

Reducing the number of boost capacitors used with an active balancing system can reduce the size and cost of the active balancing system. This can be particularly advantageous in industries requiring the use of high-voltage high-capacitance capacitors, automotive grade capacitors, or other capacitors that are expensive. Moreover, each boost capacitor can be associated with an under-voltage lockout (UVLO) circuit and other ancillary circuitry. Therefore, reducing the number of boost capacitors used with an active balancing system can reduce the amount of ancillary circuitry in the system, which also reduces the size and cost of the active balancing system. In addition, various redundancies typically present in an active balancing switch array can be eliminated, further reducing the size and cost of the active balancing system.

FIGS. 2 through 6 illustrate an example boost capacitor sharing architecture 200 for a power supply active balancing system in accordance with this disclosure. The boost capacitor sharing architecture 200 shown here could, for example, be used in the boost capacitor sharing circuitry 108 of FIG. 1. However, the boost capacitor sharing architecture 200 could be used in any other suitable active balancing system.

Figure 2:
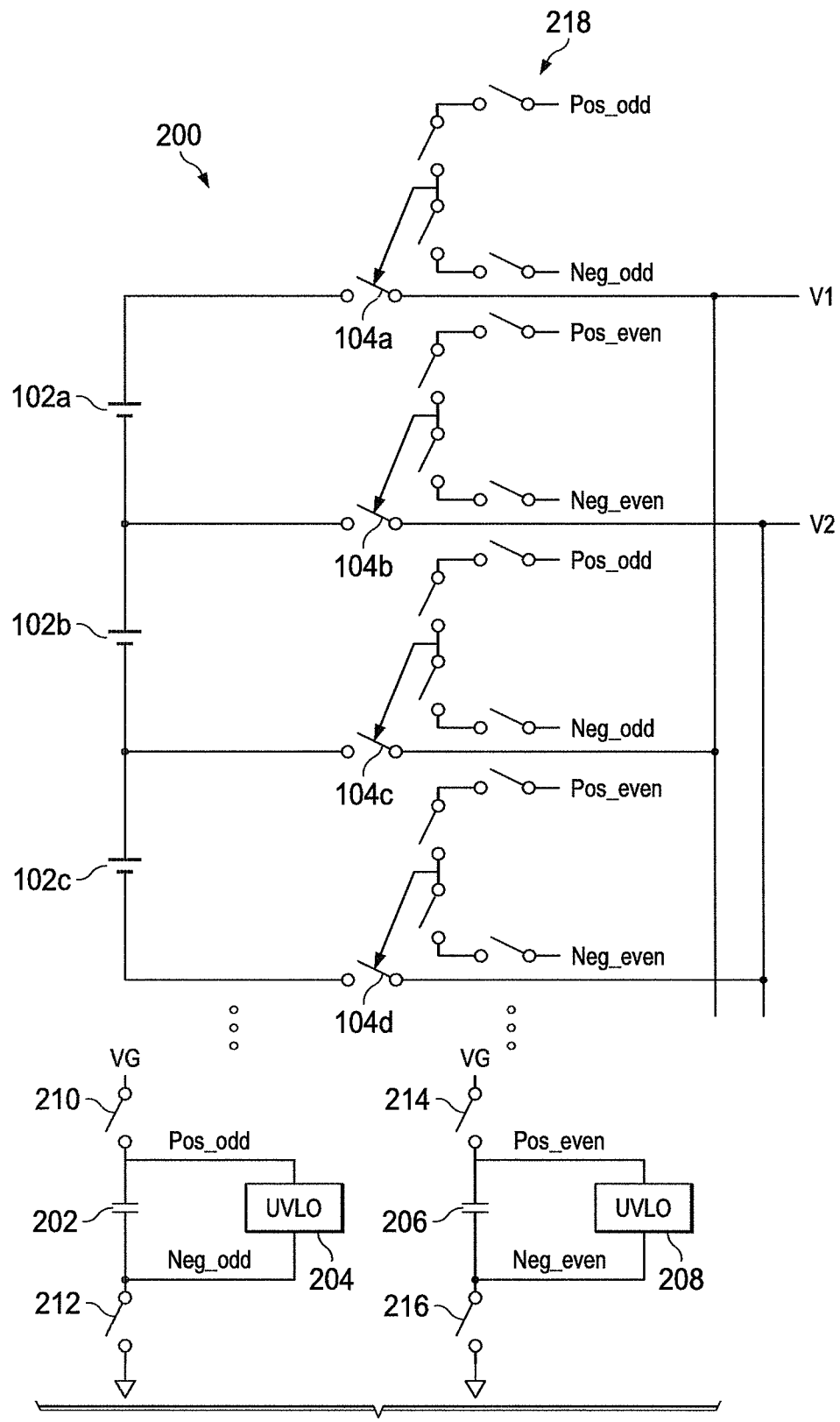
FIGS. 2 through 6 illustrate an example boost capacitor sharing architecture for a power supply active balancing system in accordance with this disclosure.

As shown in FIG. 2, the architecture 200 includes a first boost capacitor 202 and a first UVLO unit 204 coupled across the boost capacitor 202. The architecture 200 also includes a second boost capacitor 206 and a second UVLO unit 208 coupled across the boost capacitor 206. Each boost capacitor 202, 206 generally represents any suitable capacitive structure, such as a high-voltage high-capacitance capacitor or an automotive capacitor. Each UVLO unit 204, 208 monitors the voltage stored on its associated boost capacitor 202, 206, which can help to avoid the voltage decreasing below a threshold voltage and causing a selected switch 104a-104h to be turned off during its charging/discharging operation. Each UVLO unit 204, 208 includes any suitable structure for monitoring a boost capacitor.

A switch 210 couples the boost capacitor 202 to a source voltage VG, and a switch 212 couples the boost capacitor 202 to ground. Similarly, a switch 214 couples the boost capacitor 206 to the source voltage VG, and a switch 216 couples the boost capacitor 206 to ground. The switches 210-212 form a current path used to charge the boost capacitor 202, and the switches 214-216 form a current path used to charge the boost capacitor 206. Each switch 210-216 represents any suitable switching device, such as a transistor switch. Note, however, that each switch 210-212 could be replaced with a diode or other structure that lacks switching functionality.

In this example, the voltages on opposing sides of the boost capacitor 202 are denoted Pos_odd and Neg_odd, meaning these voltages are used in conjunction with driving odd-numbered switches 104a, 104c, 104e, 104g. Similarly, the voltages on opposing sides of the boost capacitor 206 are denoted Pos_even and Neg_even, meaning these voltages are used in conjunction with driving even-numbered switches 104b, 104d, 104f, 104h.

For each switch in the active balancing system 100 (switches 104a-104d are shown here), a switch sub-array 218 is used to drive the associated switch using the Pos_odd/Neg_odd signals or the Pos_even/Neg_even signals. As can be seen in FIG. 2, the switches 104a-104d are driven alternatively using the Pos_odd/Neg_odd signals and the Pos_even/Neg_even signals. That is, odd-numbered switches 104a, 104c are driven using the Pos_odd and Neg_odd signals, and even-numbered switches 104b, 104d are driven using the Pos_even and Neg_even signals. The same pattern can be repeated for the remaining switches 104e-104h in the active balancing system 100. Each switch in the sub-arrays 218 represents any suitable switching device, such as a transistor switch.

In this way, the boost capacitors 202 and 206 are shared between the switches 104a-104h, and the switch sub-arrays 218 control which switches 104a-104h are driven using the shared boost capacitors 202 and 206. This helps to reduce the numbers of boost capacitors and UVLO units needed to operate the active balancing system. In the following description, each switch 104a-104h is said to form part of a channel, and the channel can be coupled to a single power supply 102a-102g or between two power supplies 102a-102g. Each boost capacitor 202 and 206 can be shared between multiple channels using the switch sub-arrays 218.

Figure 3A:
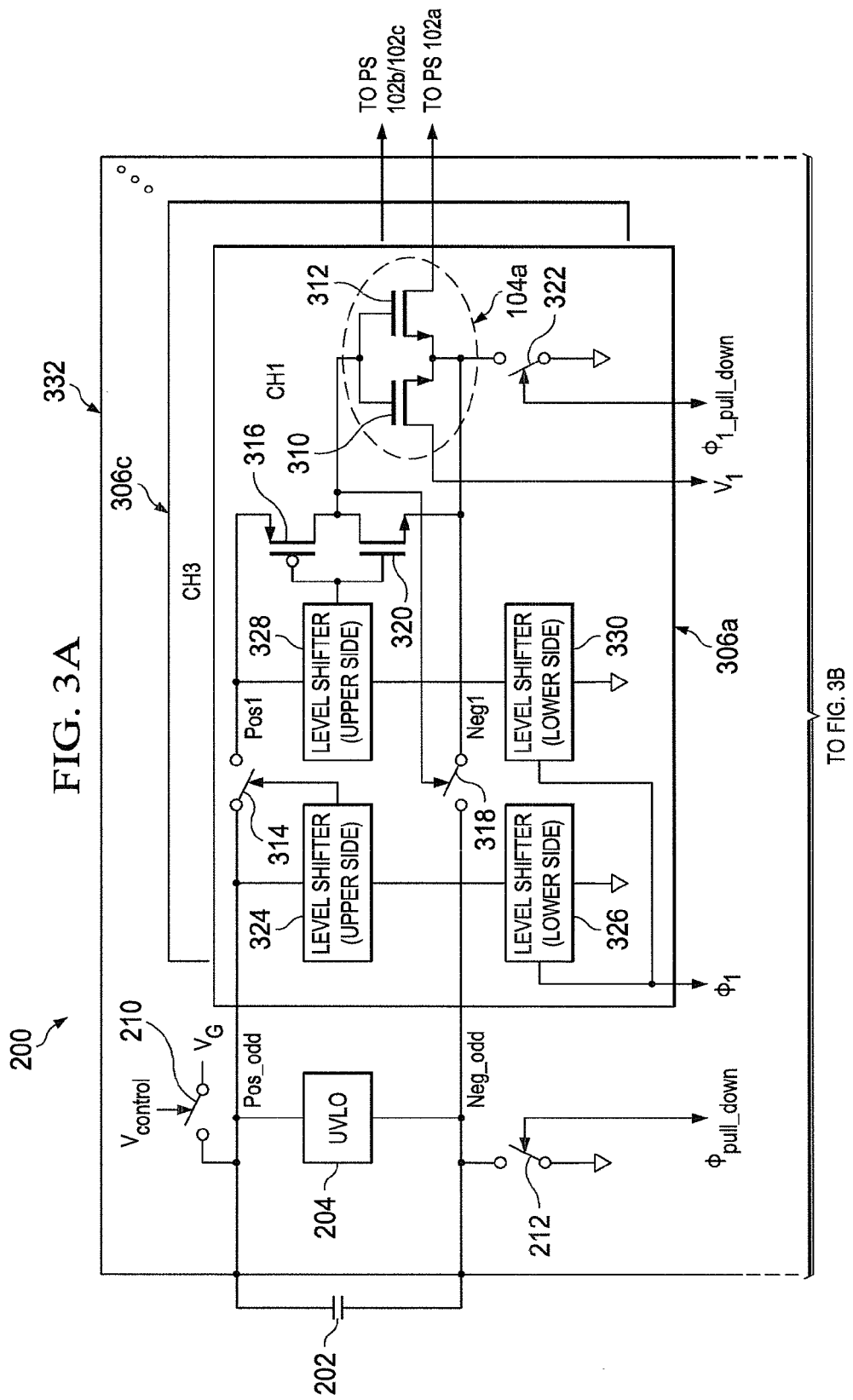
Figure 3B:
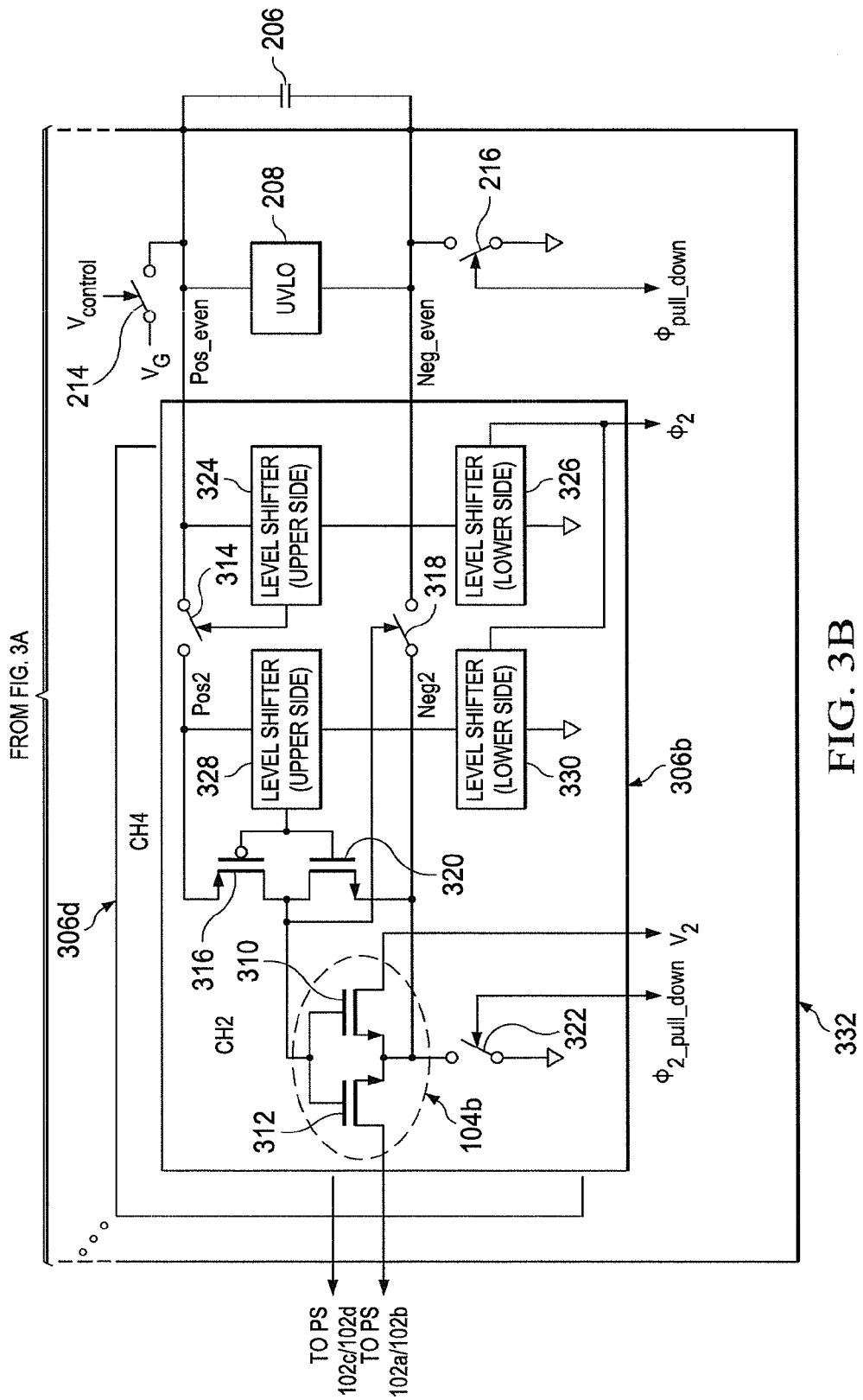

FIGS. 3A and 3B illustrate a more detailed example implementation of the boost capacitor sharing architecture 200. As shown in FIGS. 3A and 3B, the switches 210-212 are coupled to opposing ends of the boost capacitor 202 and can be used to create a current flow through the boost capacitor 202, charging the boost capacitor 202 up to VG. Similarly, the switches 214-216 are coupled to opposing ends of the boost capacitor 206 and can be used to create a current flow through the boost capacitor 206, charging the boost capacitor 206 up to VG. The switches 210, 214 are controlled by a $V_{control}$ signal. Each UVLO unit 204, 208 here is coupled across its associated boost capacitor 202, 206.

The remaining circuitry shown in FIGS. 3A and 3B is divided into multiple channels 306a-306d associated with the switches 104a-104d (additional channels can be added for additional switches 104e-104h). Each switch 104a-104d is implemented in one of the channels 306a-306d using a pair of back-to-back transistors 310-312, which collectively form a bidirectional switch. The transistor 312 is coupled to one of the power supplies 102a-102g or between two of the power supplies 102a-102g, and the transistor 310 outputs or receives a voltage $V_1$-$V_h$ (where h represents the number of switches 104a-104h and therefore the number of channels). Depending on whether a power supply 102a-102g is being charged or discharged, the voltage $V_1$-$V_h$ can be received from or provided to the charging/discharging circuitry 108. The pair of back-to-back transistors 310-312 here includes two N-channel metal oxide semiconductor (NMOS) transistors with their sources coupled together.

The remaining components in each channel form a gate driver for driving the transistor switch 104a-104h in that channel. Each switch sub-array 218 is implemented in a channel 306a-306d using four switches 314-320. As shown here, the switch 314 is coupled to one side of the capacitor 202 or 206 and to the switch 316, and the switch 316 is coupled between the switch 314 and gates of the transistors 310-312. Similarly, the switch 318 is coupled to another side of the capacitor 202 or 206 and to the switch 320, and the switch 320 is coupled between the switch 318 and the gates of the transistors 310-312. A control input of the switch 318 is also coupled between the switches 316 and 320 and to the gates of the transistors 310-312, and the switches 318-320 are also coupled to the sources of the transistors 310-312. The switches 314-320 could be implemented using any suitable switching devices. For instance, the switches 314-316 could be implemented using P-channel MOS (PMOS) transistors, and the switches 318-320 could be implemented using NMOS transistors.

A pull-down switch 322 is used to selectively couple the sources of the transistors 310-312 to ground when the switch 104a-104h is turned off. This helps to reduce leakage from the body diodes of the transistors 310-312 and helps to provide immunity against latch-up. Level shifters 324-330 are used to shift different voltage levels of signals in the channel 306a-306d, allowing the level shifters 324-330 to turn the switches 314-320 on and off in the sub-array 218. Each level shifter 324-330 represents any suitable structure for shifting the voltage level of a signal.

Note that in FIGS. 3A and 3B, a current path for charging the boost capacitor 202 passes through only the switches 210-212 and the boost capacitor 202, and a current path for charging the boost capacitor 206 passes through only the switches 214-216 and the boost capacitor 206. Because these are short loops and there are no diode voltage drops across the boost capacitors 202 and 206, the Rds(on) resistances of the switches 104a-104h decrease, and there is little if any voltage loss. Also, the presence of the switch 322 coupled between the transistors 310-312 means that leakage current through the transistor 310 can be shunted to ground when that particular channel is not operating. This helps to avoid situations where a power supply 102a-102g is receiving current (i.e. being charged) or giving current (i.e. being discharged) through the body diode of the transistor switch 310 during periods when such charging or discharging is not wanted or desired.

Figure 4:
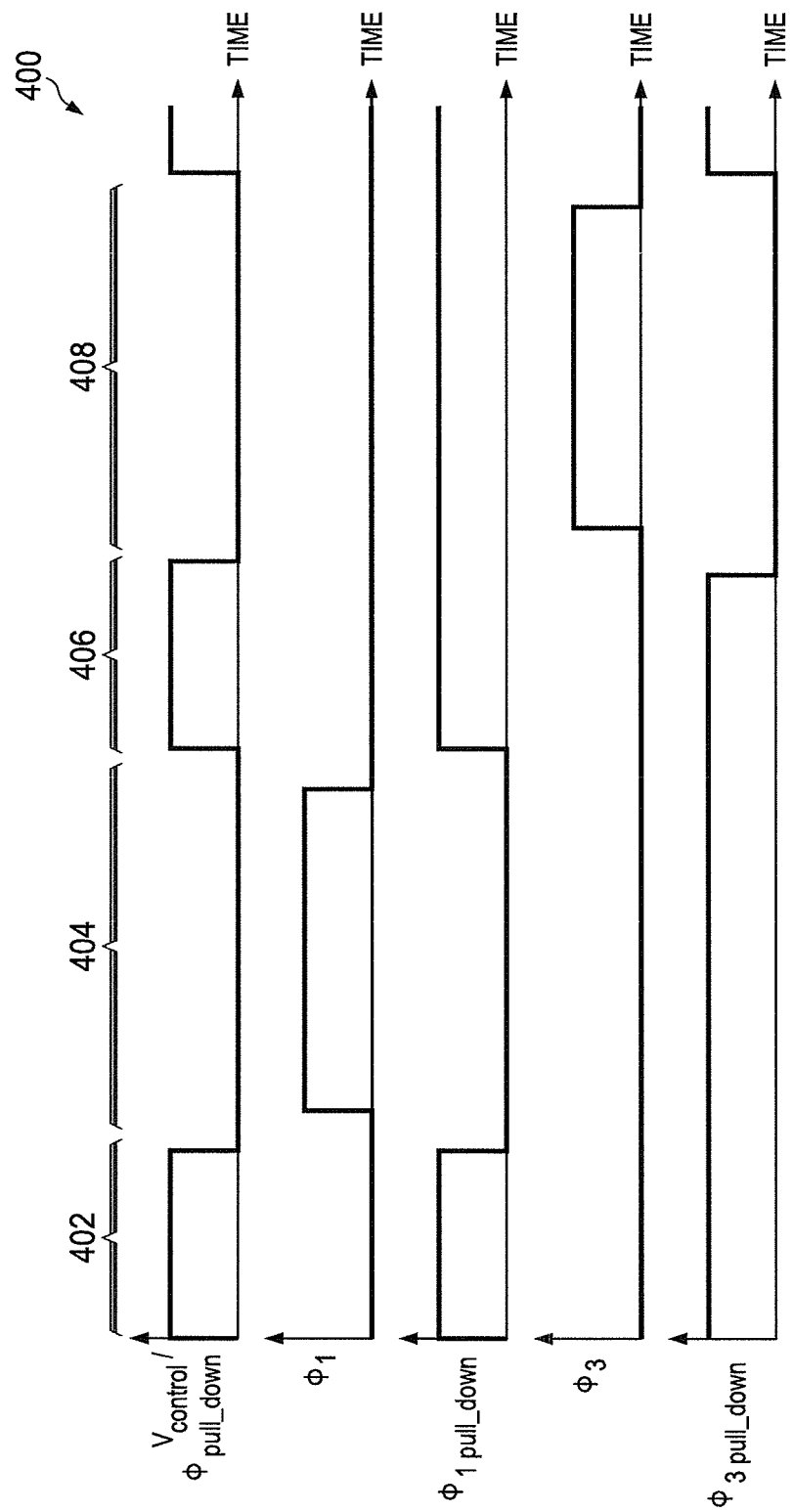

Example operations of the architecture 200 are shown in FIG. 4, which illustrates a timing diagram 400 associated with the transfer of energy from the power supply 102a to the power supply 102c. The same or similar timing diagram could be associated with the transfer of power between any other power supplies.

In FIG. 4, there are six signals shown. The $\Phi_{pull\_down}$ signal and the $V_{control}$ signal are generally used to control current flow through the boost capacitor 202 in order to control the charging of the boost capacitor 202. The $\Phi_1$ signal is used to turn the channel 306a on, and the $\Phi_3$ signal is used to turn the channel 306c on. The $\Phi_{1\_pull\_down}$ signal is used to turn the switch 322 in 306a off, and the $\Phi_{3\_pull\_down}$ signal is used to turn the switch 322 in 306c off.

During a time period 402, the $\Phi_{pull\_down}$ signal, the $V_{control}$ signal, the $\Phi_{1\_pull\_down}$ signal, and the $\Phi_{3\_pull\_down}$ signal all pulse high, while the $\Phi_1$ and $\Phi_3$ signals remain low. As a result, current flows through the boost capacitor 202, charging the boost capacitor 202. A similar action can occur with the boost capacitor 206 to charge the boost capacitor 206.

During time period 404, the $\Phi_1$ signal pulses high after the $\Phi_{pull\_down}$ signal, the $V_{control}$ signal, and the $\Phi_{1\_pull\_down}$ signal go low. This turns on the first channel 306a, meaning the voltage on the boost capacitor 202 is used to close the switch 104a. A similar action can occur in channel 306b, allowing the boost capacitor 206 to be used to close the switch 104b. This connects the power supply 102a to the charging/discharging circuitry 108, discharging the power supply 102a.

During time period 406, the $\Phi_1$ signal goes low again before the $\Phi_{pull\_down}$ signal, the $V_{control}$ signal, and the $\Phi_{1\_pull\_down}$ signal pulse high again. This disconnects the channel 306a from the switch 104a and allows current to flow again through the boost capacitor 202, recharging the boost capacitor 202. A similar action can occur with the boost capacitor 206 to recharge the boost capacitor 206.

During time period 408, the $\Phi_3$ signal pulses high after the $\Phi_{pull\_down}$ signal, the $V_{control}$ signal, and the $\Phi_{3\_pull\_down}$ signal go low. This turns on the third channel, meaning the voltage on the boost capacitor 202 is used to close the switch 104c. A similar action can occur in channel 306d, allowing the boost capacitor 206 to be used to close the switch 104d. This connects the power supply 102c to the charging/discharging circuitry 108, charging the power supply 102c.

This process can be repeated any number of times to transfer energy between power supplies. Note that while described here as supporting the transfer of power from a single power supply to another single power supply, this is not required. For example, the boost capacitor 202 could be used to close the switch 104a while the boost capacitor 206 is used to close the switch 104d, coupling three power supplies 102a-102c to the charging/discharging circuitry 108. Thus, multiple power supplies can be charged or discharged using the architecture 200 by selecting an appropriate odd-numbered switch and an appropriate even-numbered switch.

Returning to FIGS. 3A and 3B, all components of the architecture 200 except for the two boost capacitors 202 and 206 could be implemented on a single integrated circuit chip 332. In this example embodiment, the integrated circuit chip 332 could include two pins for coupling to the boost capacitor 202, two pins for coupling to the boost capacitor 206, and h pins for coupling to g (h−1) power supplies 102a-102g.

Figure 5:
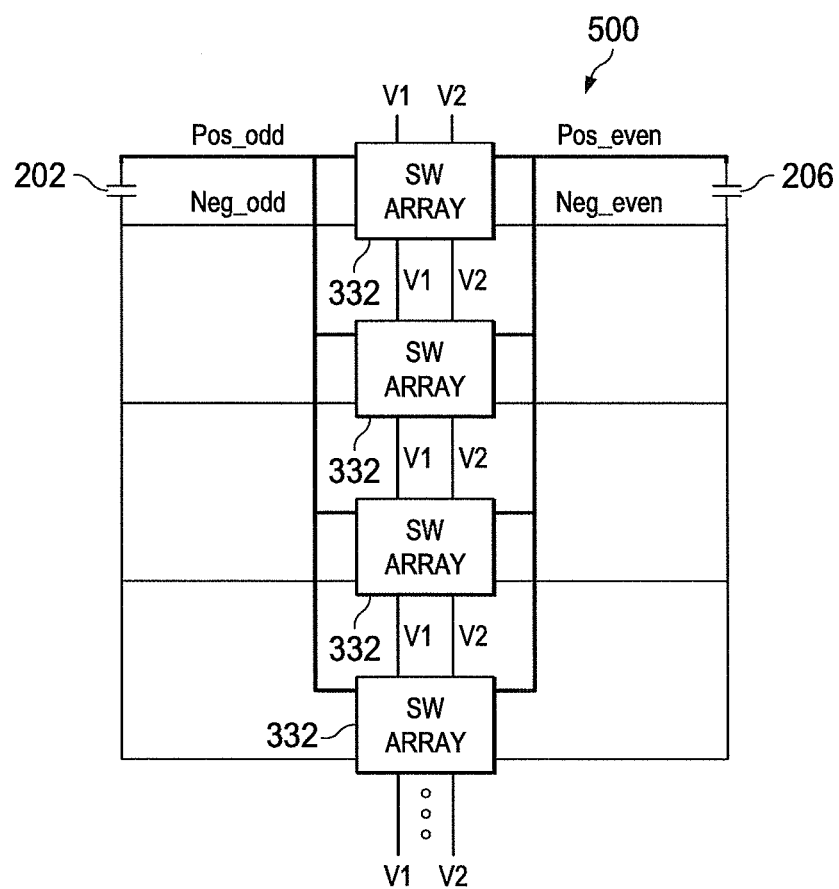

It is also possible to share the boost capacitors 202 and 206 among multiple integrated circuit chips 332. An example of this is shown in FIG. 5, where an active balancing system 500 includes multiple integrated circuit chips 332 that are used to implement multiple switch arrays. As shown here, all switch arrays share the same two boost capacitors 202 and 206. If each integrated circuit chip 332 can be coupled to g power supplies, this configuration allows the same two boost capacitors 202 and 206 to be shared when engaging in active balancing operations for n×g power supplies (where n represents number of integrated circuit chips 332).

Figure 6:
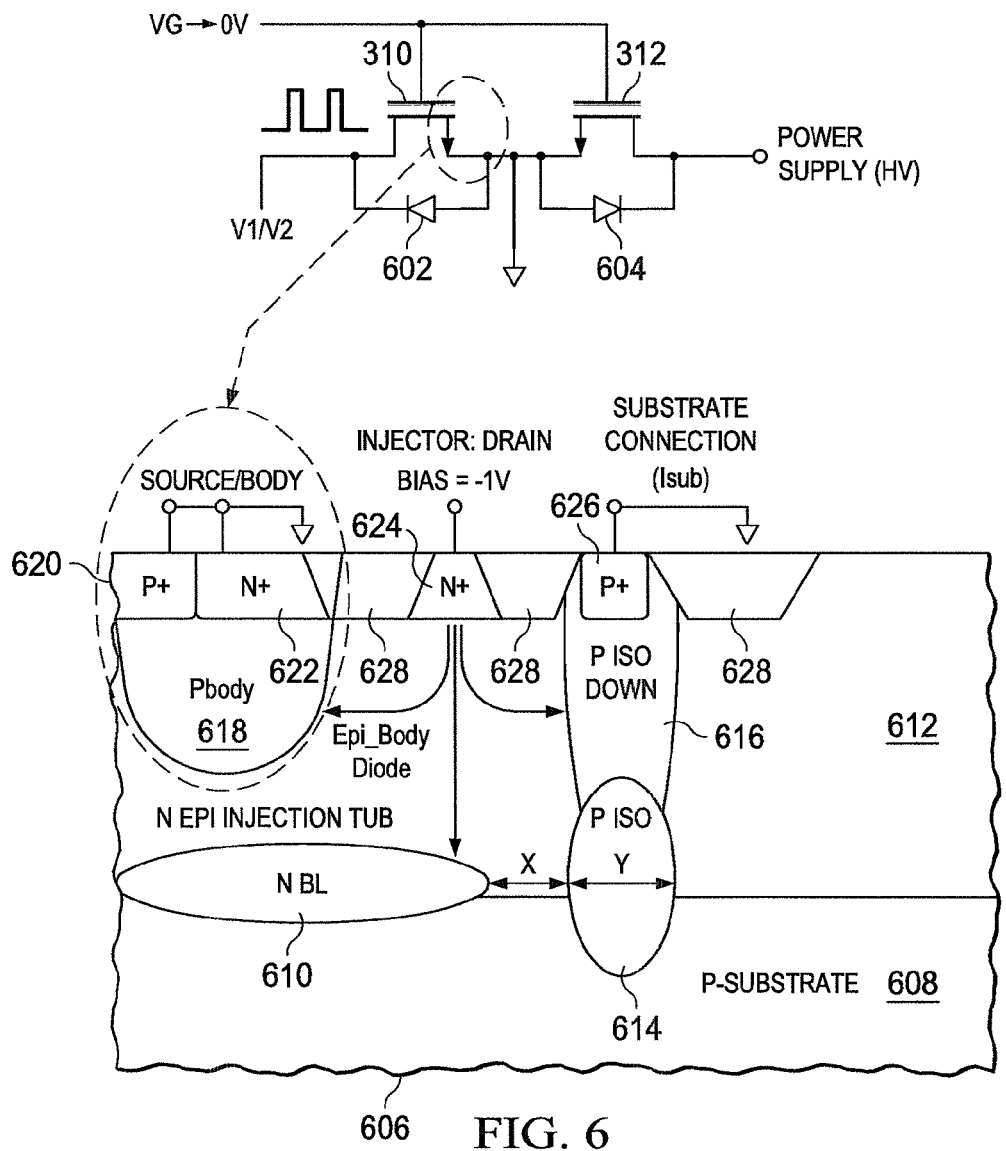

An example implementation of the back-to-back transistors 310-312 in each switch 104a-104h is shown in FIG. 6. As shown in FIG. 6, each transistor 310-312 has an associated body diode 602-604, respectively. A portion of the physical structure of the transistor 310 is also shown as a cross-section 606 in FIG. 6. This implementation of the transistor 310 can help to isolate the voltage from a power supply and prevent latch-up of the transistors 310-312.

As shown here, the transistor 310 is formed on a P− substrate 608. An N-type buried layer (BL) 610 is located between the substrate 608 and an N-type epitaxial injection tub 612. P-type isolation regions 614-616 help to provide for an electrical connection to the substrate 608. A P-type body 618 is formed in the tub 612, and P+ and N+ regions 620-622 are formed in the P-type body 618. The P+ and N+ regions 620-622 represent the source and body of the transistor 310. An N+ region 624 represents a drain of the transistor 310, and a P+ region 626 is used for connection to the substrate of the transistor 310. Isolation regions 628 (such as oxidized regions) help to electrically isolate different portions of the transistor 310.

Each region 608-628 of the transistor 310 can be formed from any suitable material(s) and in any suitable manner. For example, the substrate 608 could represent silicon or other semiconductor substrate, and each region 610-626 of the transistor 310 can be doped with any suitable P-type or N-type material(s) using any suitable fabrication technique(s). The arrows within the cross-section 606 illustrate electron movements within the transistor 310.

Although FIGS. 2 through 6 illustrate one example of a boost capacitor sharing architecture 200 for a power supply active balancing system, various changes may be made to FIGS. 2 through 6. For example, the architecture 200 could support any number of channels for any number of power supplies. Also, any suitable logic in each channel 306a-306d could be used to drive a switch using a voltage across a boost capacitor. In addition, the transistors 310-312 are not limited to the physical structures shown in FIG. 6.

Figure 7:
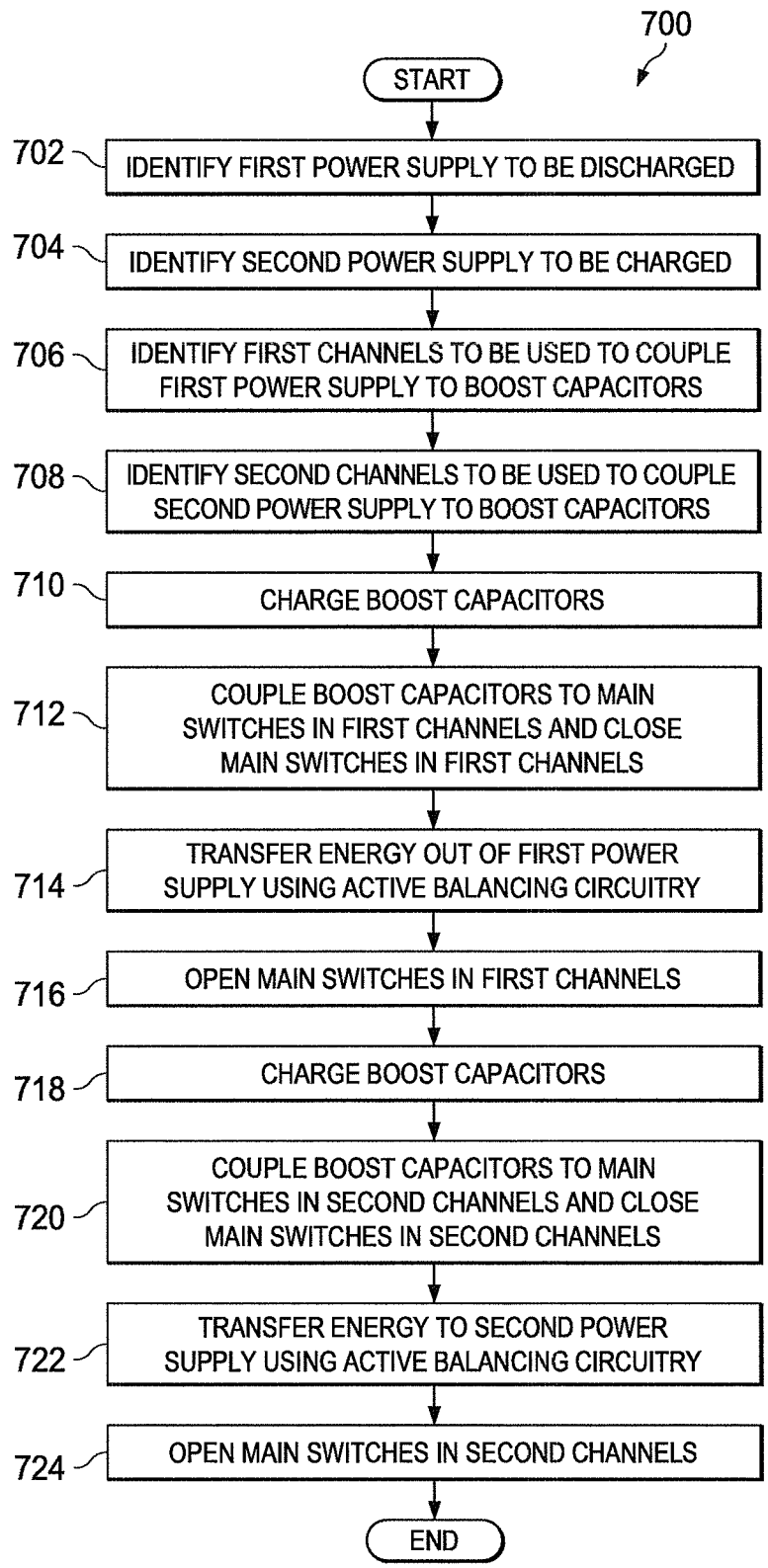
FIG. 7 illustrates an example method for boost capacitor sharing in a power supply active balancing system in accordance with this disclosure.

FIG. 7 illustrates an example method 700 for boost capacitor sharing in a power supply active balancing system in accordance with this disclosure. As shown in FIG. 7, at least one first power supply to be discharged is identified at step 702, and at least one second power supply to be charged is identified at step 704. This could include, for example, the controller 110 identifying the power supply or supplies 102a-102g having the highest output voltage(s) and identifying the power supply or supplies 102a-102g having the lowest output voltage(s).

First channels to be used to couple the first power supply or supplies to boost capacitors are identified at step 706, and second channels to be used to couple the second power supply or supplies to the boost capacitors are identified at step 708. When a single power supply is to be charged or discharged, this could include the controller 110 identifying the two switches 104a-104h coupled to the positive and negative terminals of the single power supply. When multiple power supplies are to be charged or discharged, this could include the controller 110 identifying the two switches 104a-104h coupled to the positive terminal of one outermost power supply and the negative tell final of the other outermost power supply.

The boost capacitors are charged at step 710. This could include, for example, creating a current flow through the boost capacitors 202 and 206 while using the $\Phi_1$, $\Phi_2$, $\Phi_3$, and analogous signals in the channels to keep the channels from turning on.

The boost capacitors are coupled to the main switches in the first channels, thereby closing the main switches in the first channels, at step 712. This could include, for example, using the switches 314-320 in the switch sub-arrays 218 to couple the boost capacitors 202 and 206 to the two switches 104a-104h in the identified first channels. When the main switches in the first channels are closed, this transfers energy out of the first power supply or supplies at step 714. This could include, for example, transferring energy from one or more of the power supplies 102a-102g to the charging/discharging circuitry 108 via two of the switches 104a-104h. When the transfer is completed, such as after a specified amount of time has elapsed, the main switches in the first channel are opened at step 716. This could include, for example, using the switches 314-320 in the switch sub-arrays 218 to decouple the boost capacitors 202 and 206 from the two switches 104a-104h in the identified first channels.

The boost capacitors are charged again at step 718. This could include, for example, creating a current flow through the boost capacitors 202 and 206 while using the $\Phi_1$, $\Phi_2$, $\Phi_3$, and analogous signals in the channels to keep the channels from turning on.

The boost capacitors are coupled to the main switches in the second channels, thereby closing the main switches in the second channels, at step 720. This could include, for example, using the switches 314-320 in the switch sub-arrays 218 to couple the boost capacitors 202 and 206 to the two switches 104a-104h in the identified second channels. When the main switches in the second channels are closed, this transfers energy into the second power supply or supplies at step 722. This could include, for example, transferring energy from the charging/discharging circuitry 108 to one or more of the power supplies 102a-102g via two of the switches 104a-104h. When the transfer is completed, such as after a specified amount of time has elapsed, the main switches in the second channel are opened at step 724. This could include, for example, using the switches 314-320 in the switch sub-arrays 218 to decouple the boost capacitors 202 and 206 from the two switches 104a-104h in the identified second channels.

Although FIG. 7 illustrates one example of a method 700 for boost capacitor sharing in a power supply active balancing system, various changes may be made to FIG. 7. For example, while shown as a series of steps, various steps in FIG. 7 could overlap, occur in parallel, occur in a different order, or occur any number of times.

The remaining figures illustrate example active balancing systems and example operations of those active balancing systems. These active balancing systems include different implementations of the charging/discharging circuitry 108. Note, however, that the boost capacitor sharing architecture 200 described above is not limited to use with these particular active balancing systems. The boost capacitor sharing architecture 200 described above could be used with any suitable system where the driving of different transistor switches using boost capacitors is performed.

Figure 8:
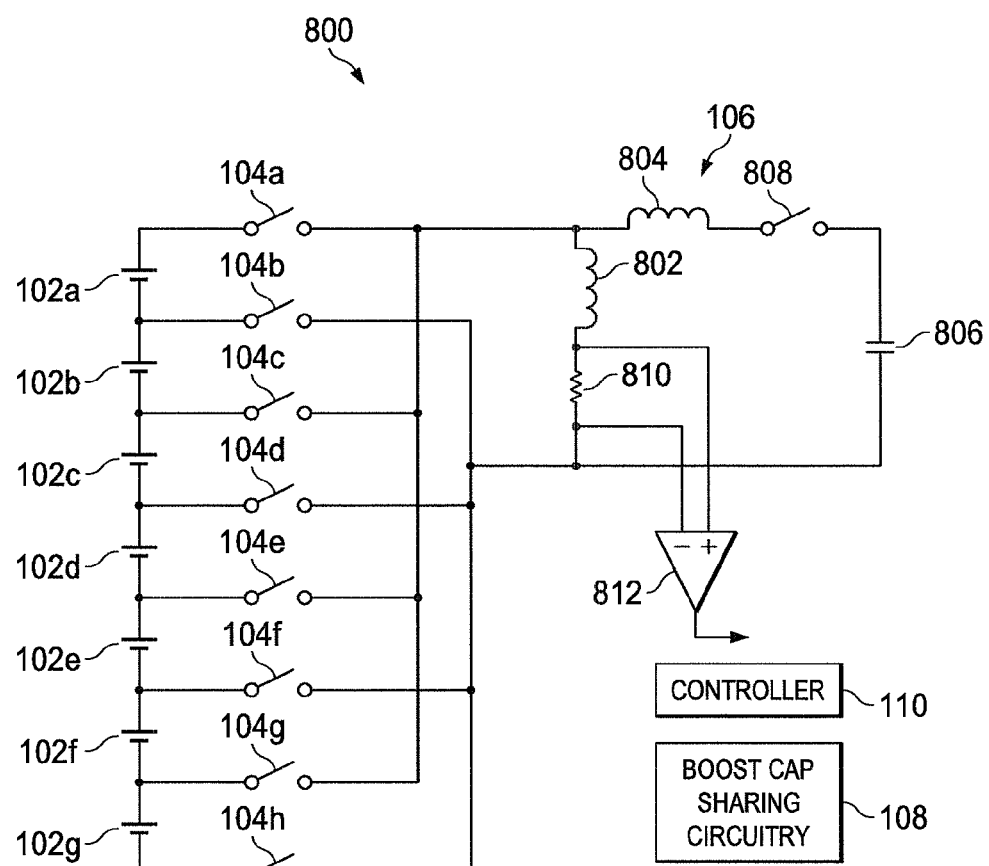
FIGS. 8 through 10D illustrate a first particular implementation of an active balancing system for batteries and other power supplies in accordance with this disclosure.

FIGS. 8 through 10D illustrate a first particular implementation of an active balancing system 800 for batteries and other power supplies in accordance with this disclosure. As shown in FIG. 8, the charging/discharging circuitry 108 forms an inductor-capacitor (LC) resonance circuit that transfers energy between the selected power supplies 102a-102g. In this example, the LC resonance circuit includes a first inductor 802, a second inductor 804, and a capacitor 806. As can be seen in FIG. 8, one end of the inductor 802 is connected to a first subset of the switches 104a-104h, and another end of the inductor 802 is connected to a second subset of the switches 104a-104h.

Each inductor 802-804 includes any suitable inductive structure having any suitable inductance. The inductance of the inductor 804 can be less (possibly much less) than the inductance of the inductor 802. In particular embodiments, the inductor 802 could have an inductance of 33 µH, and the inductor 804 could have an inductance of 1 µH. The capacitor 806 includes any suitable capacitive structure having any suitable capacitance. In particular embodiments, the capacitor 806 could have a capacitance of 1 µF.

A switch 808 is coupled in series with the inductor 804 and with the capacitor 806. The switch 808 is used to selectively create a current path through the inductor 804 and the capacitor 806, thereby selectively controlling LC resonance in the circuit 106. The switch 808 represents any suitable switching device, such as at least one bi-directional transistor. In particular embodiments, the switch 808 represents two back-to-back MOSFET transistors.

A sense resistor 810 is coupled in series with the inductor 802 and to an amplifier 812. The inductor 802 and the sense resistor 810 are also coupled in parallel to the inductor 804, the capacitor 806, and the switch 808. A voltage across the sense resistor 810 varies depending on the current through the inductor 802, and the voltage can be amplified by the amplifier 812 and provided to the controller 110 for use in controlling the system 800. The sense resistor 810 includes any suitable resistive structure having any suitable resistance (typically a very small resistance). In particular embodiments, the sense resistor 810 could have a resistance of 0.1Ω. The amplifier 812 includes any suitable structure for amplifying a signal across a sense resistor, such as an LMP8601 amplifier from TEXAS INSTRUMENTS INC. or other high common-mode voltage precision current sensing amplifier.

In the system 800 of FIG. 8, a distinction can be made between odd and even power supplies 102a-102g. Here, "odd" and "even" refer to the number assigned to the power supplies when the power supplies are numbered in series. In this example, power supplies 102a, 102c, 102e, 102g could represent "odd" power supplies, and power supplies 102b, 102d, 102f could represent "even" power supplies. This distinction is used since some energy transfers involve the use of the capacitor 806 while other energy transfers do not. In particular, power transfers from an odd-numbered power supply to an odd-numbered power supply ("odd-to-odd" transfers) and power transfers from an even-numbered power supply to an even-numbered power supply ("even-to-even" transfers) involve the capacitor 806. Power transfers from an odd-numbered power supply to an even-numbered power supply ("odd-to-even" transfers) and power transfers from an even-numbered power supply to an odd-numbered power supply ("even-to-odd" transfers) do not involve the capacitor 806.

Figure 9A:
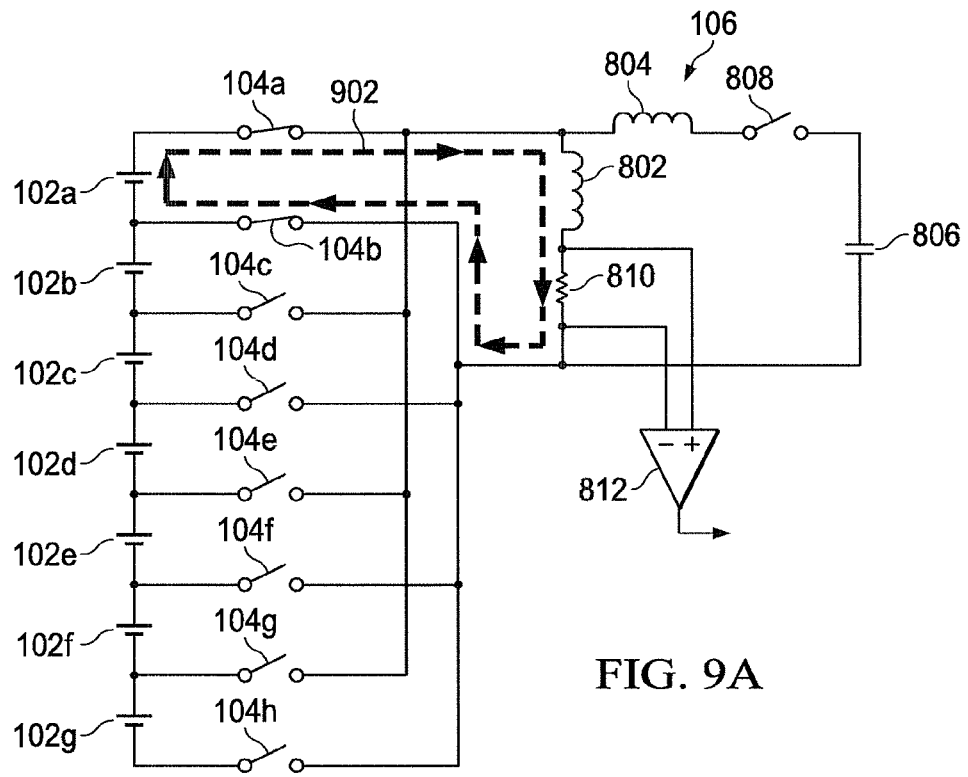
Figure 9B:
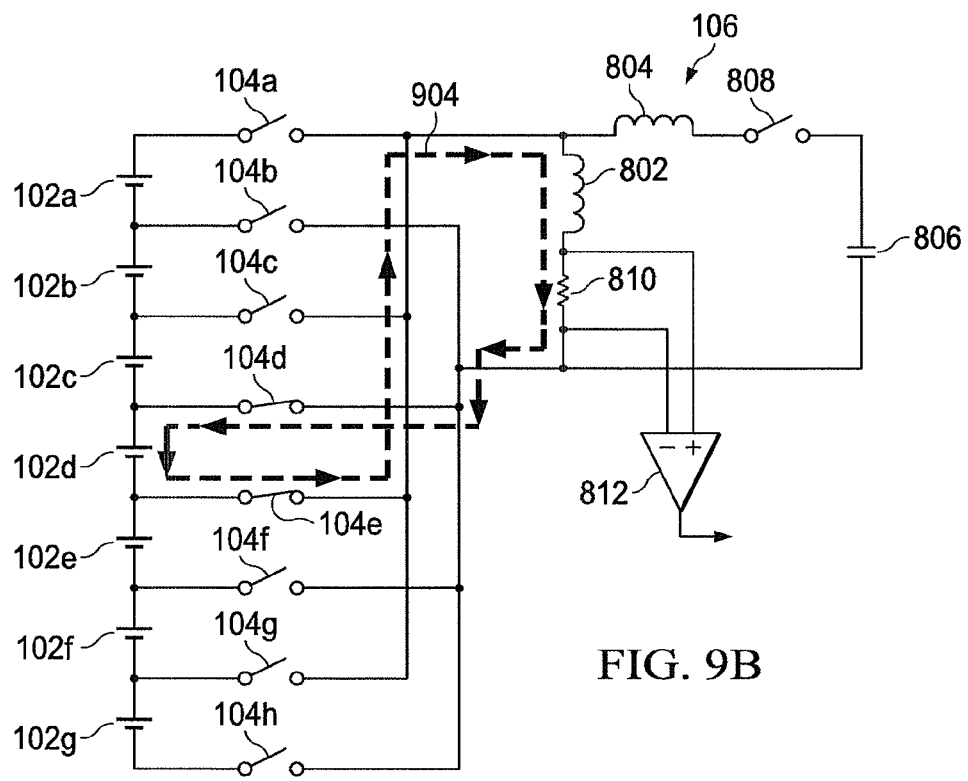

FIGS. 9A and 9B illustrate example operations of the system 800 of FIG. 8 during odd-to-even and even-to-odd power transfers in accordance with this disclosure. In this particular example, a power transfer is occurring from power supply 102a to power supply 102d, making it an odd-to-even transfer. Similar operations may occur during an even-to-odd transfer. The opening and closing of the switches 104a-104h here is controlled by the controller 110.

As shown in FIG. 9A, in order to transfer energy out of the power supply 102a, two switches 104a-104b are closed, while the remaining switches 104c-104h are opened. This creates a current path 902 through the power supply 102a. Also, the switch 808 is opened to disconnect the capacitor 806 from the current path 902. This causes current to flow from the connected power supply 102a to the inductor 802, charging the inductor 802.

As shown in FIG. 9B, in order to transfer energy from the inductor 802 to the power supply 102d, two switches 104d-104e are closed, while the remaining switches 104a-104c, 104f-104h are opened. This creates a current path 904 through the power supply 102d. Also, the switch 808 remains opened. This causes current to flow from the inductor 802 to the connected power supply 102d, charging that power supply 102d.

Note here that the currents through the inductor 802 flow in the same direction in FIGS. 9A and 9B. Also note that the same procedure could be used to transfer energy out of or into multiple power supplies, which involves closing two non-adjacent switches 104a-104h (where energy is transferred out of or into the power supplies between those non-adjacent switches).

FIGS. 10A through 10D illustrate example operations of the system 800 of FIG. 8 during odd-to-odd and even-to-even power transfers in accordance with this disclosure. In this particular example, a power transfer is occurring from power supply 102a to power supply 102c, making it an odd-to-odd transfer. Similar operations may occur during an even-to-even transfer. The opening and closing of the switches 104a-104h here is controlled by the controller 110.

Figure 10A:
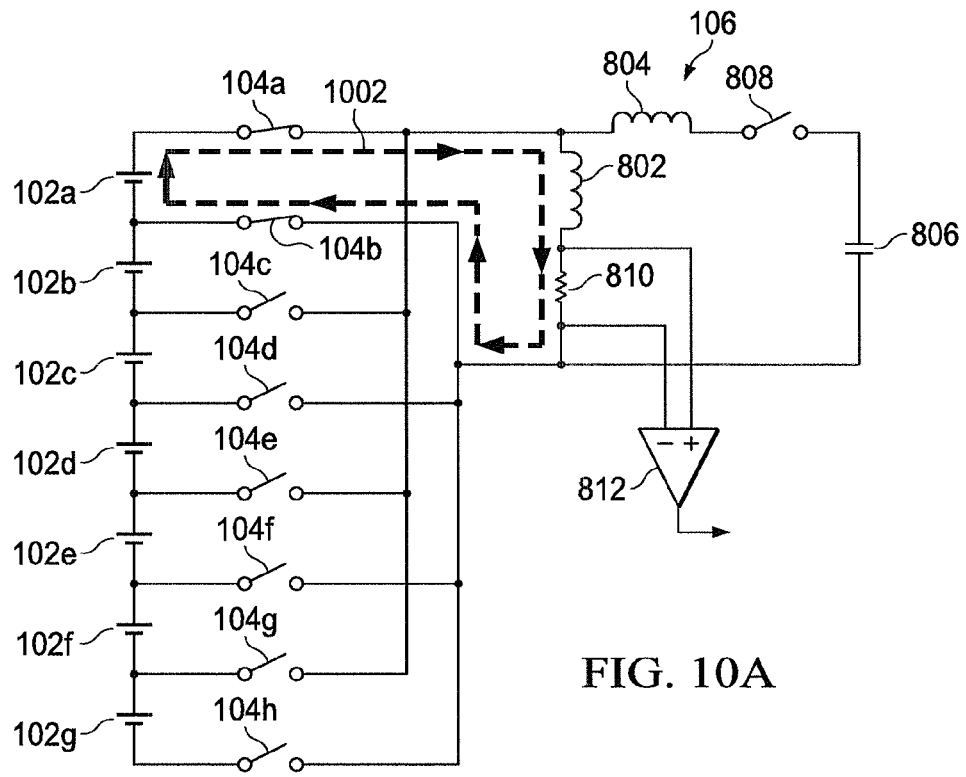

As shown in FIG. 10A, in order to transfer energy out of the power supply 102a, two switches 104a-104b are closed, while the remaining switches 104c-104h are opened. This creates a current path 1002 through the power supply 102a. Also, the switch 808 is opened to disconnect the capacitor 806 from the current path 1002. This causes current to flow from the connected power supply 102a to the inductor 802, charging the inductor 802.

Figure 10B:
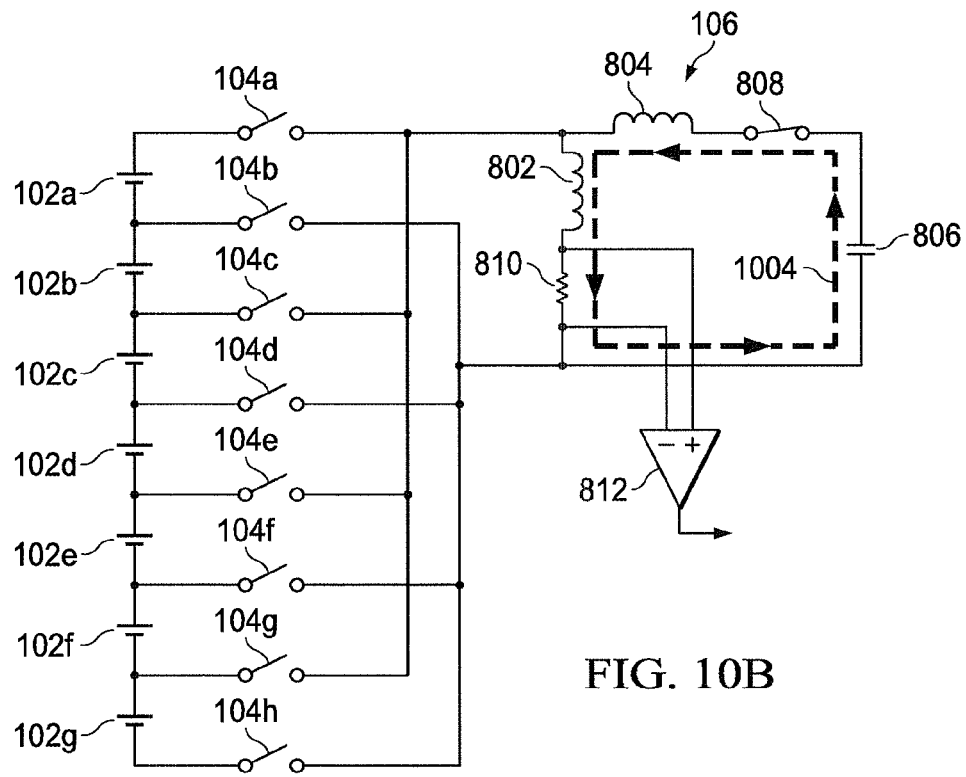

As shown in FIG. 10B, all of the switches 104a-104h are opened, and the switch 808 is closed. This causes current to flow from the inductor 802 to the capacitor 806 as part of a current flow 1004. This current flow 1004 transfers at least some of the energy stored on the inductor 802 to the capacitor 806.

Figure 10C:
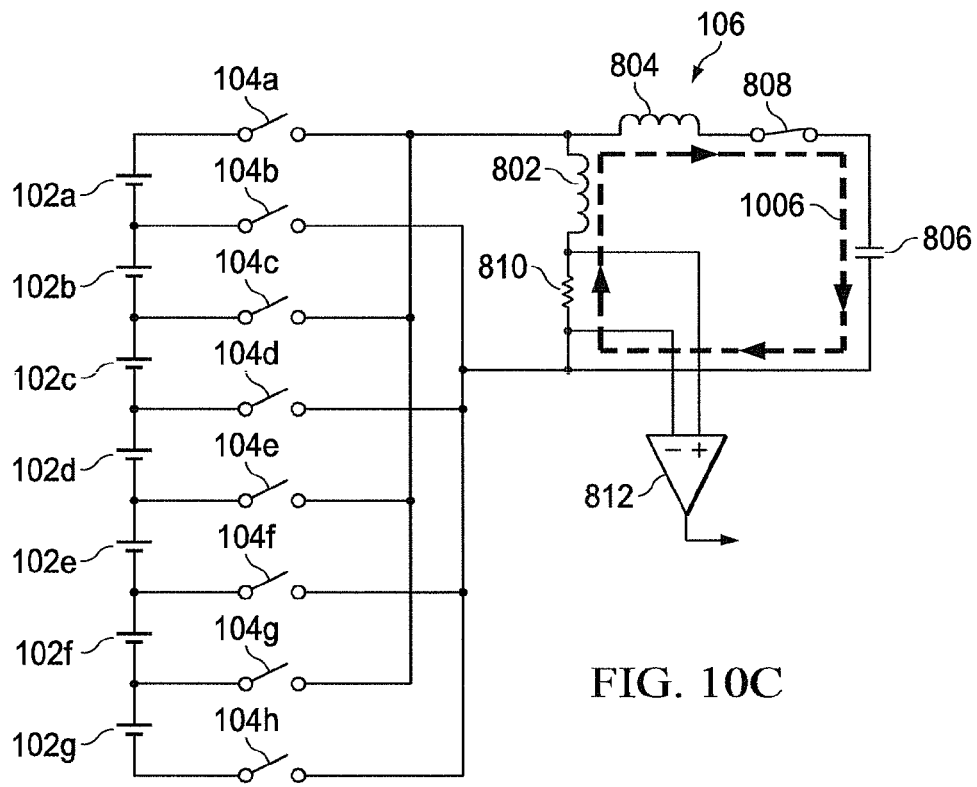

As shown in FIG. 10C, all of the switches 104a-104h remain opened, and the switch 808 remains closed. This causes current to flow from the capacitor 806 to the inductor 802 during resonance as part of a current flow 1006. After half of the resonate cycle time, the combined effect of the resonance in FIGS. 10B and 10C is to reverse the direction of current flow through the inductor 802.

Figure 10D:
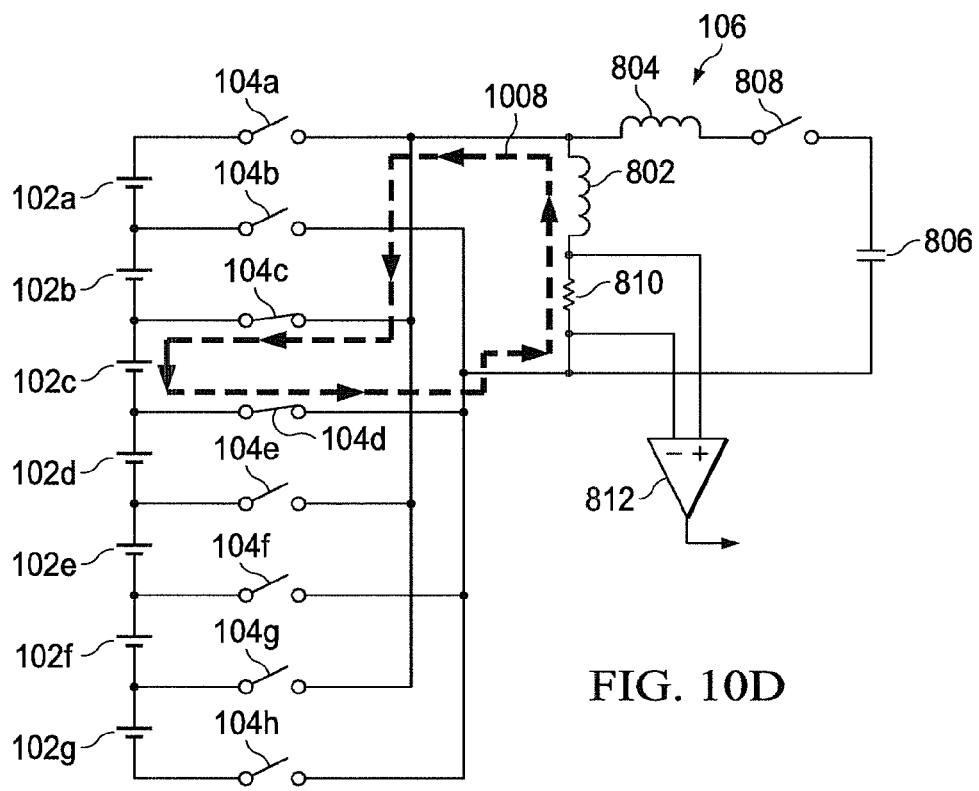

As shown in FIG. 10D, in order to transfer energy from the inductor 802 to the power supply 102c, two switches 104c-104d are closed, while the remaining switches 104a-104b, 104e-104h are opened. This creates a current path 1008 through the power supply 102c. Also, the switch 808 is opened. This causes current to flow from the inductor 802 to the connected power supply 102c, charging that power supply 102c. However, the current flows in the opposite direction through the inductor 802 than in FIG. 10A.

Additional details regarding the structure and operation of the system 800 can be found in U.S. Patent Publication No. 2013/0093248 published on Apr. 18, 2013 (which is hereby incorporated by reference in its entirety).

Figure 11:
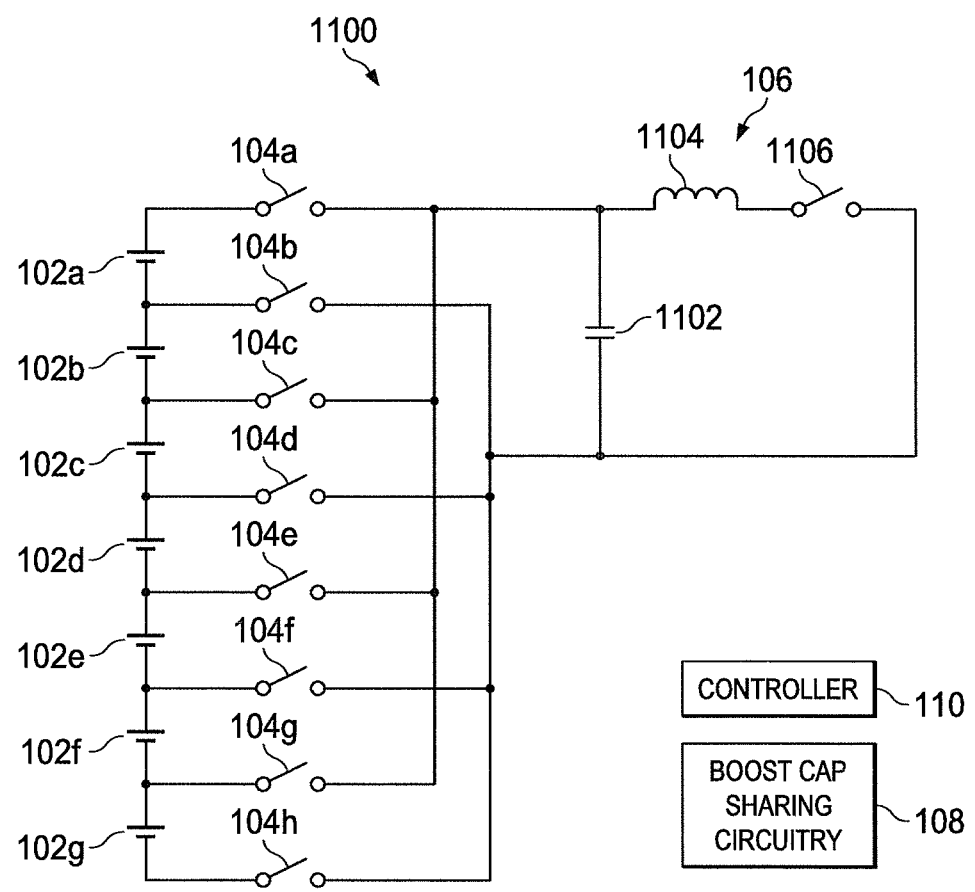
FIGS. 11 through 13D illustrate a second particular implementation of an active balancing system for batteries and other power supplies in accordance with this disclosure.

FIGS. 11 through 13D illustrate a second particular implementation of an active balancing system 1100 for batteries and other power supplies in accordance with this disclosure. As shown in FIG. 11, the charging/discharging circuitry 108 again forms an LC resonance circuit that transfers energy between the selected power supplies 102a-102g. In this example, the LC resonance circuit includes a capacitor 1102, an inductor 1104, and a switch 1106. As can be seen in FIG. 11, one end of the capacitor 1102 is connected to a first subset of the switches 104a-104h, and another end of the capacitor 1102 is connected to a second subset of the switches 104a-104h. The capacitor 1102 includes any suitable capacitive structure having any suitable capacitance. The inductor 1104 includes any suitable inductive structure having any suitable inductance.

The switch 1106 is coupled in series with the capacitor 1102 and the inductor 1104. The switch 1106 is used to selectively create a current path through the capacitor 1102 and the inductor 1104, thereby selectively controlling LC resonance in the circuit 106. The switch 1106 represents any suitable switching device, such as at least one bi-directional transistor. In particular embodiments, the switch 1106 represents two back-to-back MOSFET transistors.

In the system 1100 of FIG. 11, a distinction can again be made between odd and even power supplies 102a-102g. Power supplies 102a, 102c, 102e, 102g could represent "odd" power supplies, and power supplies 102b, 102d, 102f could represent "even" power supplies.

Figure 12A:
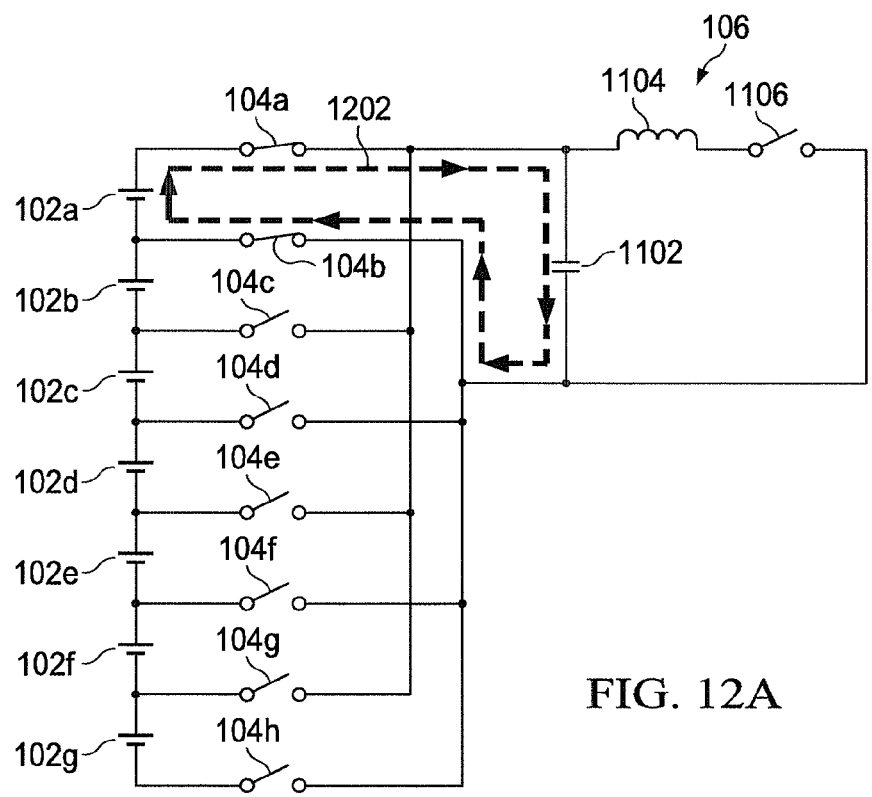
Figure 12B:
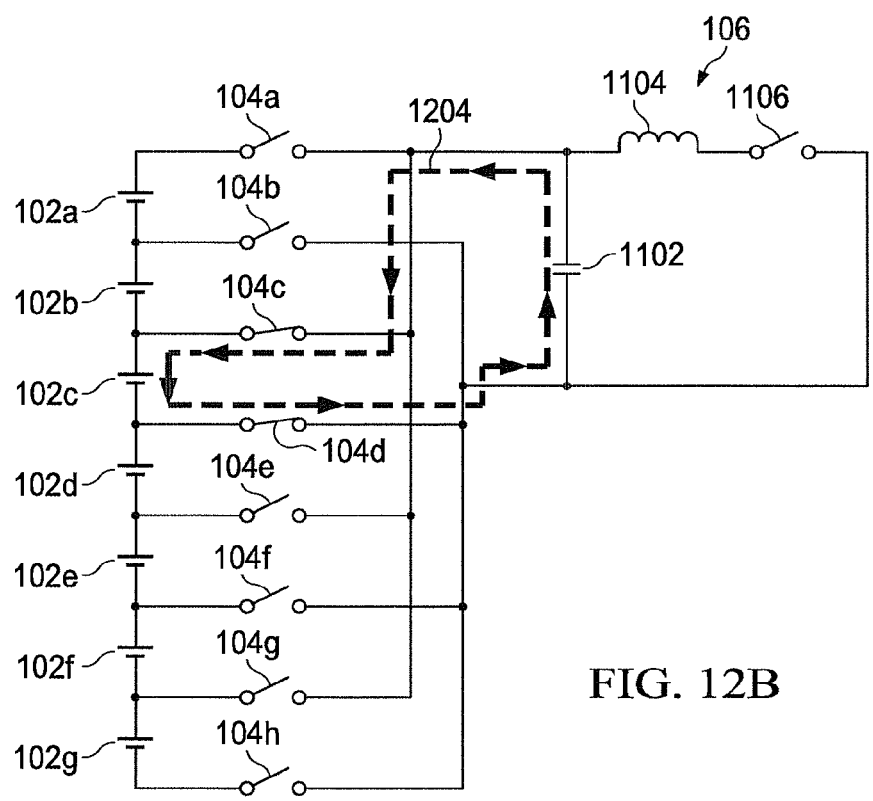

FIGS. 12A and 12B illustrate example operations of the system 1100 of FIG. 11 during odd-to-odd and even-to-even power transfers in accordance with this disclosure. In this particular example, a power transfer is occurring from power supply 102a to power supply 102c, making it an odd-to-off transfer. Similar operations may occur during an even-to-even transfer. The opening and closing of the switches 104a-104h here is controlled by the controller 110.

As shown in FIG. 12A, in order to transfer energy out of the power supply 102a, two switches 104a-104b are closed, while the remaining switches 104c-104h are opened. This creates a current path 1202 through the power supply 102a. Also, the switch 1106 is opened to disconnect the inductor 1104 from the current path 1202. This causes current to flow from the connected power supply 102a to the capacitor 1102, charging the capacitor 1102.

As shown in FIG. 12B, in order to transfer energy from the capacitor 1102 to the power supply 102c, two switches 104c-104d are closed, while the remaining switches 104a-104b, 104e-104h are opened. This creates a current path 1204 through the power supply 102c. Also, the switch 1106 remains opened. This causes current to flow from the capacitor 1102 to the connected power supply 102c, charging that power supply 102c.

Note here that the currents through the capacitor 1102 flow in opposite directions in FIGS. 12A and 12B (one way for charging, another way for discharging). In this implementation, complementary PWM signaling can be used to control the switches for the power supply being discharged and the power supply being charged. Also note that the same procedure could be used to transfer energy out of or into multiple power supplies, which involves closing two non-adjacent switches 104a-104h (where energy is transferred out of or into the power supplies between those non-adjacent switches).

FIGS. 13A through 13D illustrate example operations of the system 1100 of FIG. 11 during odd-to-even and even-to-odd power transfers in accordance with this disclosure. In this particular example, a power transfer is occurring from power supply 102a to power supply 102b, making it an odd-to-even transfer. Similar operations may occur during an even-to-odd transfer. The opening and closing of the switches 104a-104h here is controlled by the controller 110.

Figure 13A:
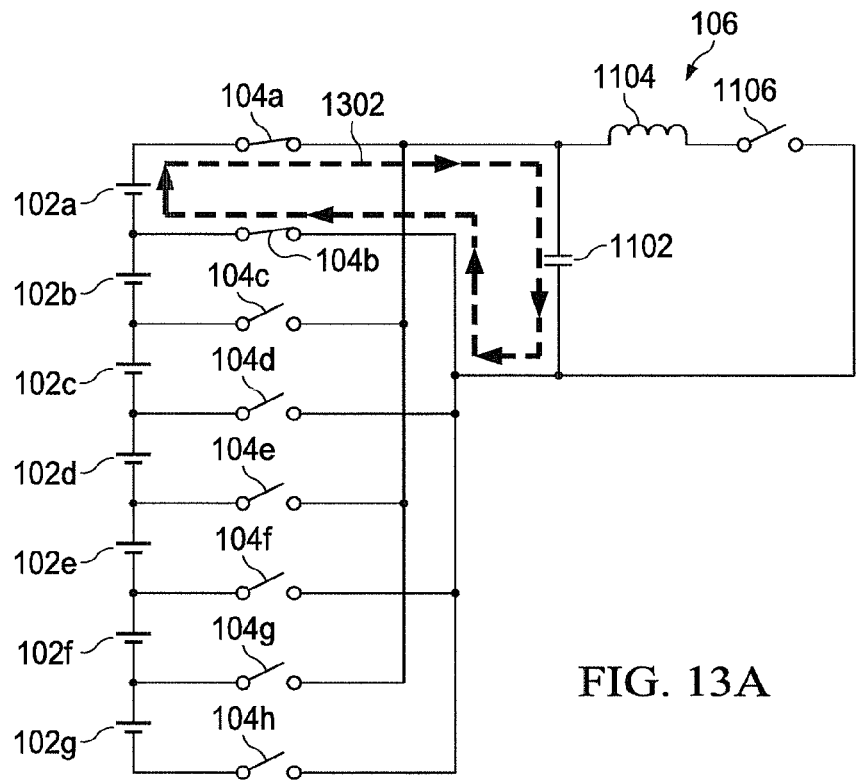

As shown in FIG. 13A, in order to transfer energy out of the power supply 102a, two switches 104a-104b are closed, while the remaining switches 104c-104h are opened. This creates a current path 1302 through the power supply 102a. Also, the switch 1106 is opened to disconnect the inductor 1104 from the current path 1302. This causes current to flow from the connected power supply 102a to the capacitor 1102, charging the capacitor 1102.

Figure 13B:
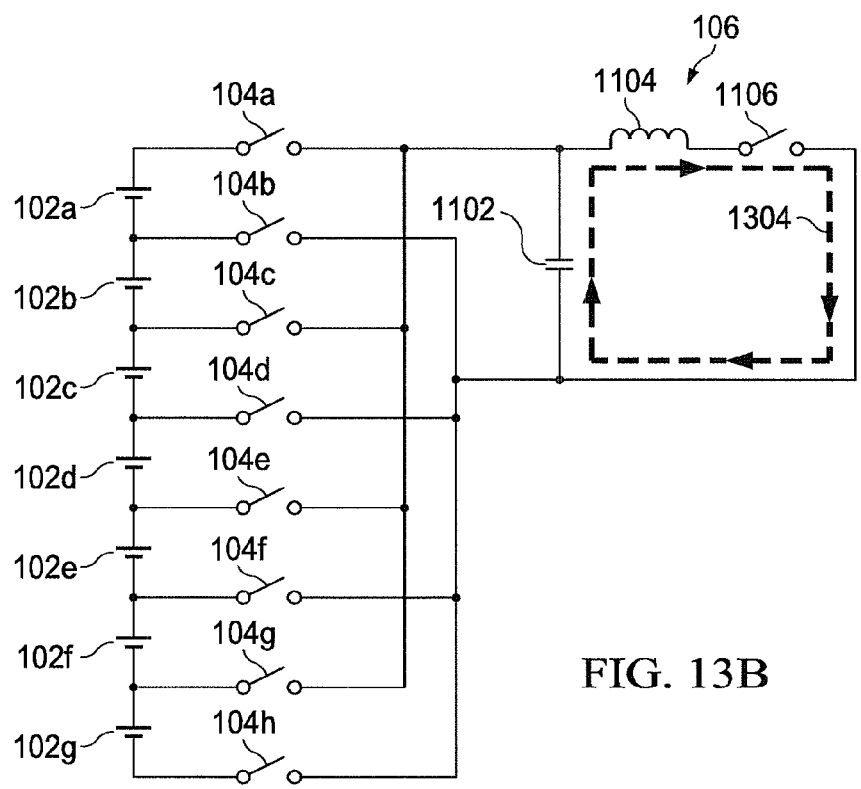

As shown in FIG. 13B, all of the switches 104a-104h are opened, and the switch 1106 is closed. This causes current to flow from the capacitor 1102 to the inductor 1104 as part of a current flow 1304. This current flow 1304 transfers at least some of the energy stored on the capacitor 1102 to the inductor 1104.

Figure 13C:
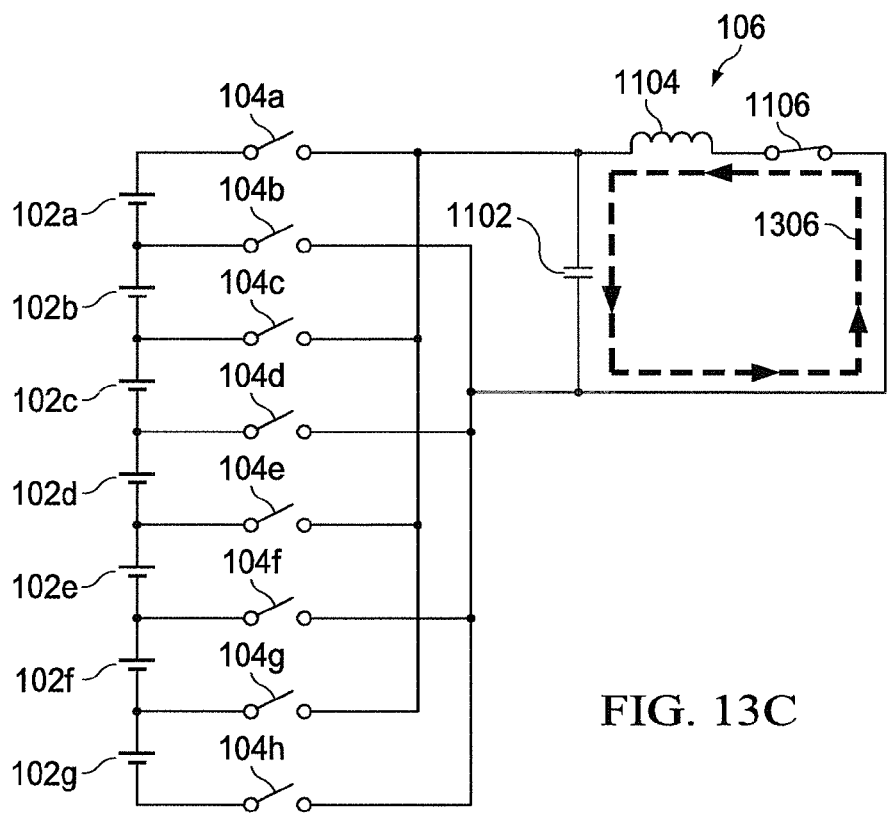

As shown in FIG. 13C, all of the switches 104a-104h remain opened, and the switch 1106 remains closed. This causes current to flow from the inductor 1104 to the capacitor 1102 during resonance as part of a current flow 1306. This current flow 1306 transfers at least some of the energy stored on the inductor 1104 back to the capacitor 1102. The combined effect of the resonance in FIGS. 13B and 13C is to allow the capacitor 1102 to be charged and discharged by currents flowing in the same direction through the capacitor 1102. This effectively reverses the capacitor's discharge direction.

Figure 13D:
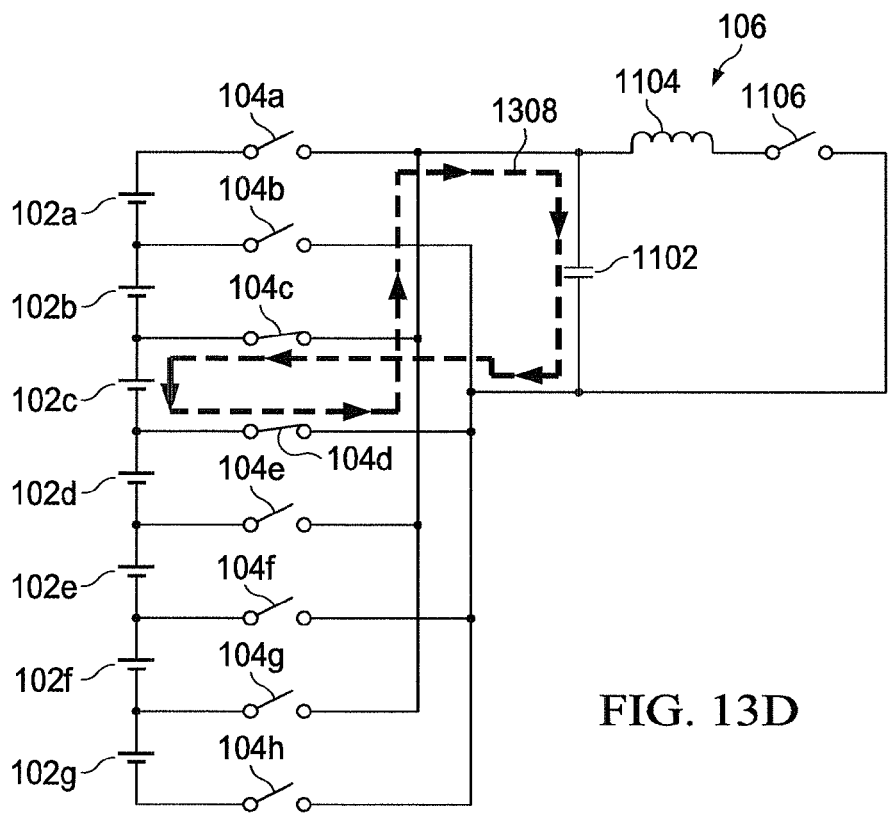

As shown in FIG. 13D, in order to transfer energy from the capacitor 1102 to the power supply 102b, two switches 104b-104c are closed, while the remaining switches 104a, 104d-104h are opened. This creates a current path 1308 through the power supply 102b. Also, the switch 1106 is opened to disconnect the inductor 1104 from the current path 1308. This causes current to flow from the capacitor 1102 to the connected power supply 102b, charging that power supply 102b. However, the discharging current flows in the same direction through the capacitor 1102 as the charging current in FIG. 13A.

Additional details regarding the structure and operation of the system 1100 can be found in U.S. Patent Publication No. 2013/0093395 published on Apr. 18, 2013 (which is hereby incorporated by reference in its entirety).

Figure 14:
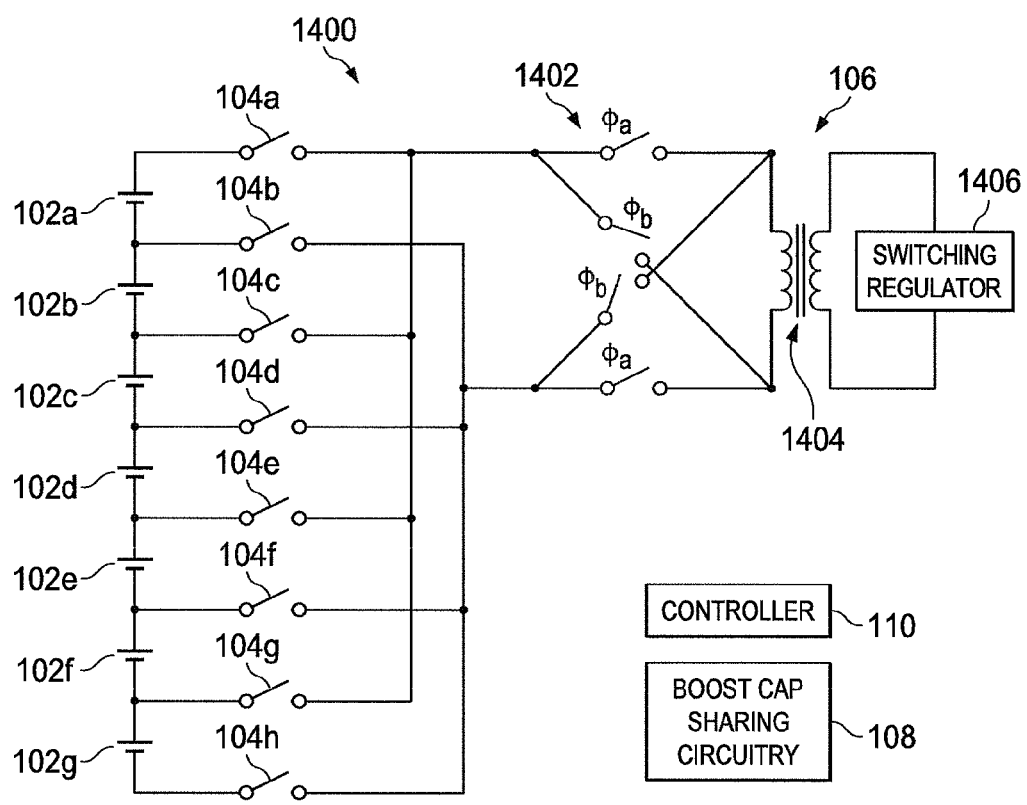
FIGS. 14 through 18 illustrate a third particular implementation of an active balancing system for batteries and other power supplies in accordance with this disclosure.

FIGS. 14 through 18 illustrate a third particular implementation of an active balancing system 1400 for batteries and other power supplies in accordance with this disclosure. As shown in FIG. 14, the charging/discharging circuitry 108 here includes a set of switches 1402, a transformer 1404, and a switching regulator 1406. The switches 1402 here include an outer set of straight-connected switches controlled by a control signal $\Phi_a$ and an inner set of cross-connected switches controlled by a control signal $\Phi_b$. Each switch 1402 includes any suitable switching device, such as a transistor switch. The transformer 1404 includes any suitable transformer device having any suitable ratio between its windings. The switching regulator 1406 includes any suitable regulator for controlling the operation of a transformer. The opening and closing of the switches 104a-104h and the switches 1402 here is controlled by the controller 110.

Figure 15:
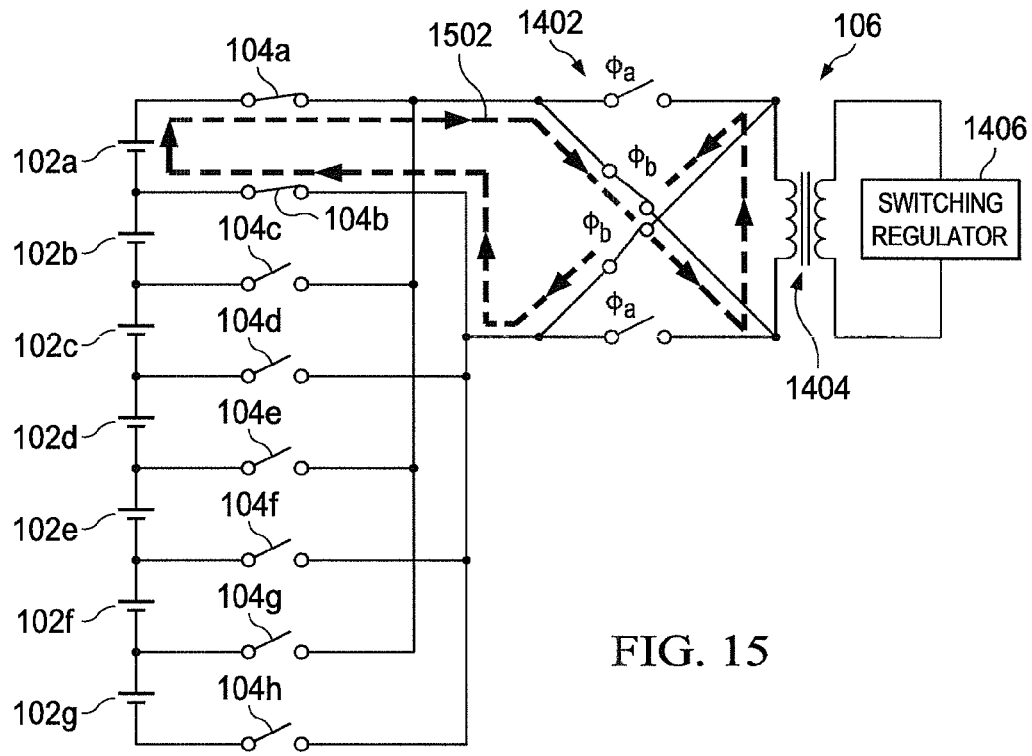

FIG. 15 illustrates an example discharging of an odd-number power supply in the system 1400. In this particular example, a power transfer is occurring from power supply 102a, although similar operations may occur during the transfer of power from another odd-number power supply. As shown in FIG. 15, in order to transfer energy out of the power supply 102a, two switches 104a-104b are closed, while the remaining switches 104c-104h are opened. Also, the outer straight-connected switches 1402 are opened, while the inner cross-connected switches 1402 are opened and closed under the control of the $\Phi_b$ signal. This creates a current path 1502 through the power supply 102a, transferring energy from the power supply 102a to the transformer 1404.

Figure 16:
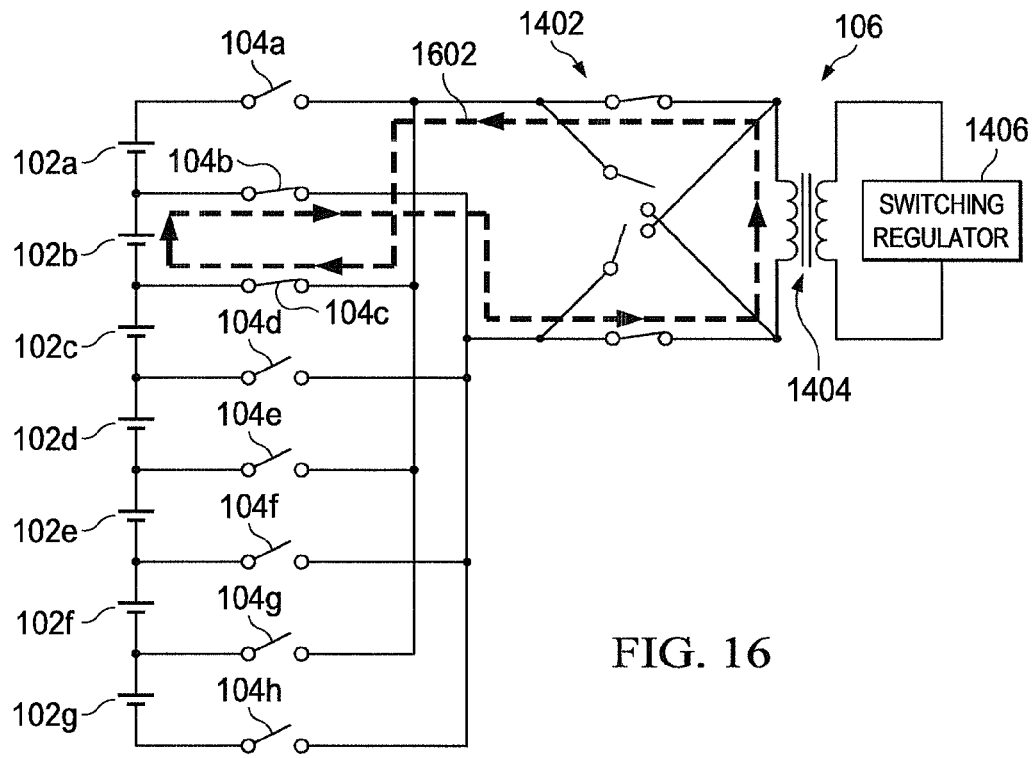

FIG. 16 illustrates an example discharging of an even-number power supply in the system 1400. In this particular example, a power transfer is occurring from power supply 102b, although similar operations may occur during the transfer of power from another even-number power supply. As shown in FIG. 16, in order to transfer energy out of the power supply 102b, two switches 104b-104c are closed, while the remaining switches 104a, 104d-104h are opened. Also, the outer straight-connected switches 1402 are opened and closed under the control of the $\Phi_a$ signal, while the inner cross-connected switches 1402 are opened. This creates a current path 1602 through the power supply 102a, transferring energy from the power supply 102b to the transformer 1404.

Figure 17:
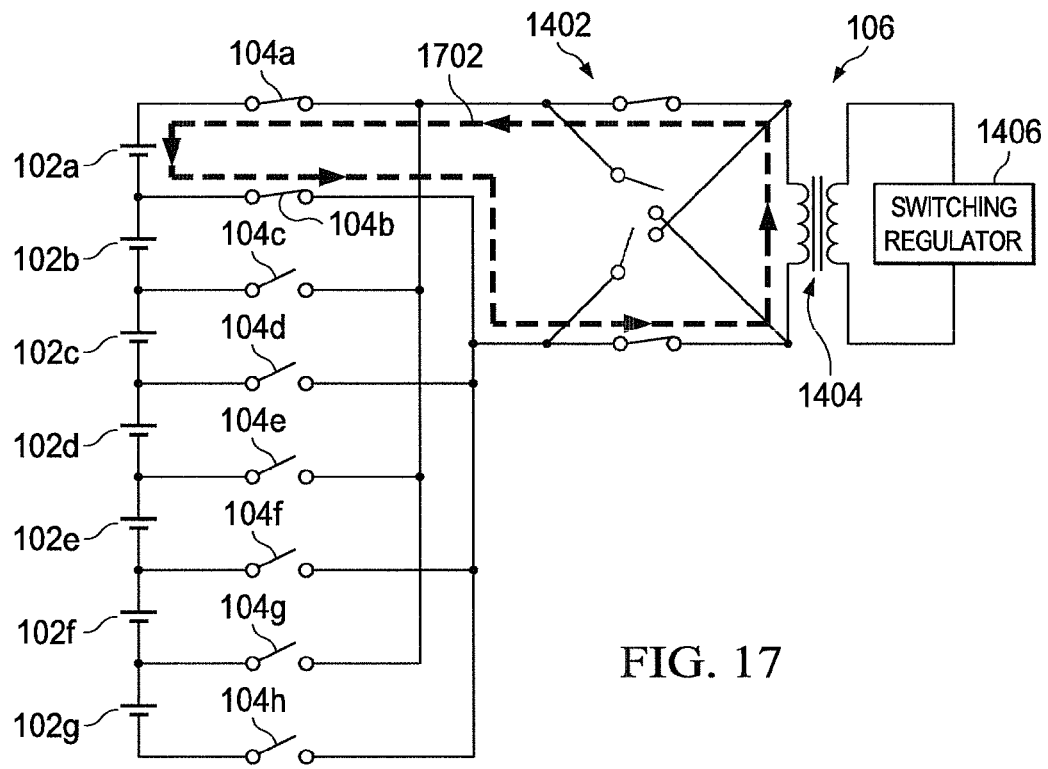

FIG. 17 illustrates an example charging of an odd-number power supply in the system 1400. In this particular example, a power transfer is occurring to power supply 102a, although similar operations may occur during the transfer of power to another odd-number power supply. As shown in FIG. 17, in order to transfer energy to the power supply 102a, two switches 104a-104b are closed, while the remaining switches 104c-104h are opened. Also, the outer straight-connected switches 1402 are opened and closed under the control of the $\Phi_a$ signal, while the inner cross-connected switches 1402 are opened. This creates a current path 1702 through the power supply 102a, transferring energy to the power supply 102a from the transformer 1404.

Figure 18:
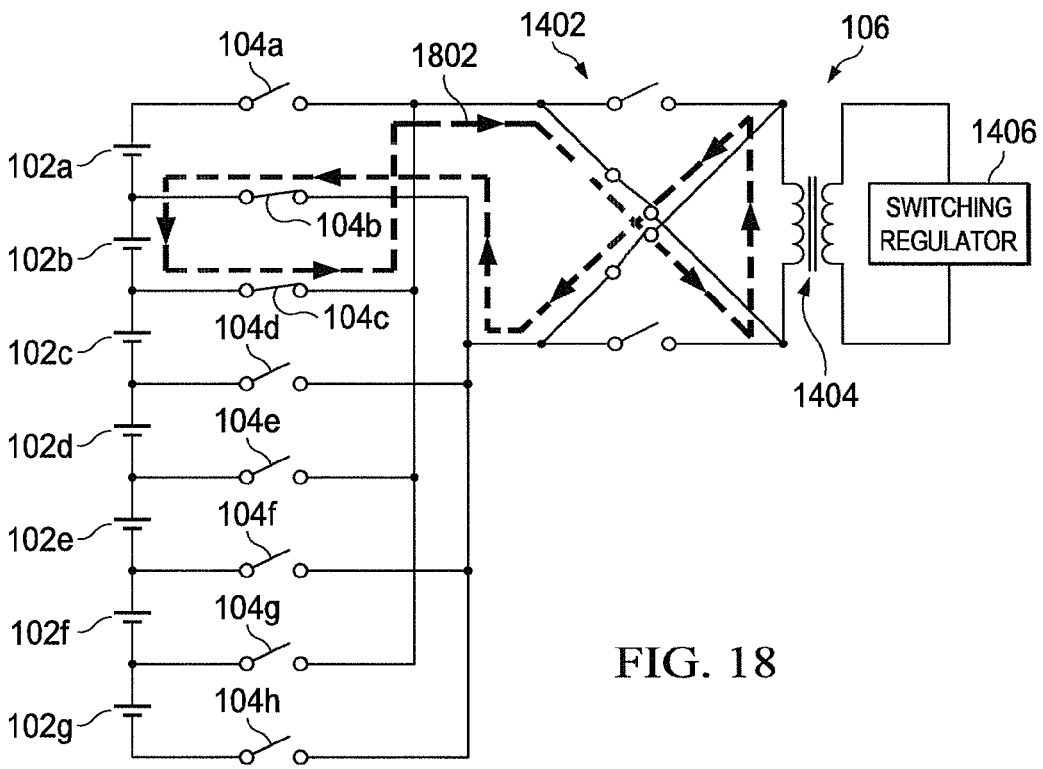

FIG. 18 illustrates an example charging of an even-number power supply in the system 1400. In this particular example, a power transfer is occurring to power supply 102b, although similar operations may occur during the transfer of power to another even-number power supply. As shown in FIG. 18, in order to transfer energy to the power supply 102b, two switches 104b-104c are closed, while the remaining switches 104a, 104d-104h are opened. Also, the outer straight-connected switches 1402 are opened, while the inner cross-connected switches 1402 are opened and closed under the control of the $\Phi_b$ signal. This creates a current path 1802 through the power supply 102a, transferring energy to the power supply 102b from the transformer 1404.

As can be seen in FIGS. 15 through 18, the outer and inner switches 1402 are used to ensure that currents to and from the odd-numbered and even-numbered power supplies flow in the same direction through the transformer 1404. This allows the system 1400 to transfer energy between odd-numbered and even-numbered power supplies without needing to create any resonance to reverse the current flow through the transformer 1404.

Although FIGS. 8 through 18 illustrate various examples of particular implementations of an active balancing system for batteries and other power supplies, various changes may be made to FIGS. 8 through 18. For example, any suitable number(s), type(s), and arrangement(s) of power supplies could be used in the systems. Also, various components in each system could be rearranged as desired, such as by moving a switch from one side of a component to another side of the same component. Further, additional components could be added to each system according to particular needs. In addition, while specific circuit components are shown, other circuit components for performing the same or similar function(s) could be used. Moreover, while various figures illustrate transfers between specific power supplies, transfers between other power supplies or collections of power supplies could occur. Finally, note that any particular values (such as inductances, capacitances, and resistances) given above may represent exact or approximate values and are related to specific implementations of a circuit.

It may be advantageous to set forth definitions of certain words and phrases that have been used within this patent document. The term "couple" and its derivatives refer to any direct or indirect communication between components, whether or not those components are in physical contact with each other. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
    multiple first channels configured to be coupled to a first boost capacitor; and
    multiple second channels configured to be coupled to a second boost capacitor;
    wherein each channel includes a transistor switch and a gate driver configured to drive the transistor switch;
    wherein the gate drivers in the first channels include switch sub-arrays configured to control which transistor switch in the first channels is driven using a voltage from the first boost capacitor; and
    wherein the gate drivers in the second channels include switch sub-arrays configured to control which transistor switch in the second channels is driven using a voltage from the second boost capacitor.

2. The apparatus of claim 1, wherein:
    the transistor switch in each channel includes first and second transistors having their sources coupled together; and
    each of the channels further includes a pull-down switch configured to pull the sources of the first and second transistors to ground.

3. The apparatus of claim 2, wherein:
    the first transistor is configured to be coupled to a power supply; and
    the second transistor is configured to provide energy being transferred out of the power supply and to receive energy being transferred into the power supply.

4. The apparatus of claim 1, wherein the switch sub-array in each channel includes:
    a first switch configured to be coupled to a first side of one of the boost capacitors;
    a second switch coupled between the first switch and the transistor switch;
    a third switch configured to be coupled to a second side of one of the boost capacitors; and
    a fourth switch coupled between the third switch and the transistor switch.

5. The apparatus of claim 4, wherein each channel further includes:
    multiple level shifters configured to turn the first, second, third, and fourth switches on and off.

6. The apparatus of claim 1, further comprising:
    first and second switches coupled to opposing ends of the first boost capacitor and configured to charge the first boost capacitor; and
    third and fourth switches coupled to opposing ends of the second boost capacitor and configured to charge the second boost capacitor.

7. The apparatus of claim 1, further comprising:
    a first under-voltage lockout (UVLO) unit configured to be coupled across the first boost capacitor; and
    a second UVLO unit configured to be coupled across the second boost capacitor.

8. A system comprising:
    a first boost capacitor;
    a second boost capacitor; and
    boost capacitor sharing circuitry that includes multiple first channels coupled to the first boost capacitor and multiple second channels coupled to the second boost capacitor;
    wherein each channel includes a transistor switch and a gate driver configured to drive the transistor switch;
    wherein the gate drivers in the first channels include switch sub-arrays configured to control which transistor switch in the first channels is driven using a voltage from the first boost capacitor; and
    wherein the gate drivers in the second channels include switch sub-arrays configured to control which transistor switch in the second channels is driven using a voltage from the second boost capacitor.

9. The system of claim 8, wherein:
    the transistor switch in each channel includes first and second transistors having their sources coupled together; and
    each of the channels further includes a pull-down switch configured to pull the sources of the first and second transistors to ground.

10. The system of claim 9, wherein:
    the first transistor is configured to be coupled to a power supply; and
    the second transistor is configured to provide energy being transferred out of the power supply and to receive energy being transferred into the power supply.

11. The system of claim 8, wherein the switch sub-array in each channel includes:
    a first switch configured to be coupled to a first side of one of the boost capacitors;
    a second switch coupled between the first switch and the transistor switch;
    a third switch configured to be coupled to a second side of one of the boost capacitors; and
    a fourth switch coupled between the third switch and the transistor switch.

12. The system of claim 11, wherein each channel further includes:
    multiple level shifters configured to turn the first, second, third, and fourth switches on and off.

13. The system of claim 8, wherein the boost capacitor sharing circuitry further includes:
    first and second switches coupled to opposing ends of the first boost capacitor and configured to charge the first boost capacitor; and
    third and fourth switches coupled to opposing ends of the second boost capacitor and configured to charge the second boost capacitor.

14. The system of claim 8, wherein the boost capacitor sharing circuitry further includes:
    a first under-voltage lockout (UVLO) unit configured to be coupled across the first boost capacitor; and
    a second UVLO unit configured to be coupled across the second boost capacitor.

15. The system of claim 8, further comprising:
    multiple power supplies coupled in series;
    wherein the transistor switch in each channel is configured to be coupled to at least one of the power supplies.

16. The system of claim 15, further comprising:
active balancing circuitry configured to transfer energy between the power supplies through the channels.

17. The system of claim 8, wherein:
the boost capacitor sharing circuitry resides within a first integrated circuit chip, the first integrated circuit chip coupled to the first and second boost capacitors; and
the system further comprises additional boost capacitor sharing circuitry residing on a second integrated circuit chip, the second integrated circuit chip coupled to the first and second boost capacitors.

18. A method comprising:
operating multiple first channels coupled to a first boost capacitor and multiple second channels coupled to a second boost capacitor, wherein each of the channels includes a transistor switch and a gate driver configured to drive the transistor switch; and
transferring energy between power supplies through the channels;
wherein the gate drivers in the first channels include switch sub-arrays controlling which transistor switch in the first channels is driven using a voltage from the first boost capacitor; and
wherein the gate drivers in the second channels include switch sub-arrays controlling which transistor switch in the second channels is driven using a voltage from the second boost capacitor.

19. The method of claim 18, wherein:
the transistor switch in each channel includes first and second transistors having their sources coupled together; and
each of the channels further includes a pull-down switch that pulls the sources of the first and second transistors to ground when that channel is not transferring energy to or from the power supplies.

20. The method of claim 18, wherein:
during a first time period, the first and second boost capacitors are charged;
during a second time period, the switch sub-arrays are configured to drive one of the transistor switches in the first channels using the voltage from the first boost capacitor and to drive one of the transistor switches in the second channels using the voltage from the second boost capacitor, and energy is transferred out of one or more of the power supplies;
during a third time period, the first and second boost capacitors are charged; and
during a fourth time period, the switch sub-arrays are configured to drive another of the transistor switches in the first channels using the voltage from the first boost capacitor and to drive another of the transistor switches in the second channels using the voltage from the second boost capacitor, and energy is transferred to one or more of the power supplies.

\* \* \* \* \*